United States Patent
Inoue et al.

(10) Patent No.: US 8,339,837 B2
(45) Date of Patent: Dec. 25, 2012

(54) DRIVING METHOD OF SEMICONDUCTOR DEVICE

(75) Inventors: Hiroki Inoue, Kanagawa (JP); Kiyoshi Kato, Kanagawa (JP); Takanori Matsuzaki, Kanagawa (JP); Shuhei Nagatsuka, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 5 days.

(21) Appl. No.: 13/206,547

(22) Filed: Aug. 10, 2011

(65) Prior Publication Data

US 2012/0051116 A1    Mar. 1, 2012

(30) Foreign Application Priority Data

Aug. 26, 2010 (JP) .................. 2010-189587
Jan. 14, 2011 (JP) .................. 2011-005766

(51) Int. Cl.
*G11C 11/24* (2006.01)
(52) U.S. Cl. .................. 365/149; 365/230.05
(58) Field of Classification Search .................. 365/149, 365/230.05, 189.03, 189.04
See application file for complete search history.

(56) References Cited

U.S. PATENT DOCUMENTS

| | | | |
|---|---|---|---|
| 4,466,081 A | 8/1984 | Masuoka | |
| 6,016,268 A * | 1/2000 | Worley | 365/149 |
| 6,127,702 A | 10/2000 | Yamazaki et al. | |
| 6,737,695 B2 * | 5/2004 | Beer | 257/300 |
| 7,088,606 B2 * | 8/2006 | Turner | 365/149 |
| 2010/0148171 A1 | 6/2010 | Hayashi et al. | |
| 2011/0101351 A1 | 5/2011 | Yamazaki | |
| 2011/0121878 A1 | 5/2011 | Kato et al. | |
| 2011/0122670 A1 | 5/2011 | Yamazaki et al. | |
| 2011/0122673 A1 | 5/2011 | Kamata et al. | |
| 2011/0128777 A1 | 6/2011 | Yamazaki et al. | |
| 2011/0147737 A1 | 6/2011 | Yamazaki et al. | |
| 2011/0156025 A1 | 6/2011 | Shionoiri et al. | |
| 2011/0156027 A1 | 6/2011 | Yamazaki et al. | |

(Continued)

FOREIGN PATENT DOCUMENTS

| | | |
|---|---|---|
| EP | 0 053 878 A2 | 6/1982 |
| JP | 57-105889 A | 7/1982 |

OTHER PUBLICATIONS

Tomoyuki Ishii et al.; "A Poly-Silicon TFT With a Sub-5-nm Thick Channel for Low-Power Gain Cell Memory in Mobile Applications"; IEEE Transactions on Electron Devices; Nov. 1, 2004; vol. 51; No. 11; pp. 1805-1810.

(Continued)

*Primary Examiner* — Vu Le
(74) *Attorney, Agent, or Firm* — Fish & Richardson P.C.

(57) ABSTRACT

A semiconductor device with a novel structure and a driving method thereof are provided. A semiconductor device includes a non-volatile memory cell including a writing transistor including an oxide semiconductor, a reading p-channel transistor including a semiconductor material different from that of the writing transistor, and a capacitor. Data is written to the memory cell by turning on the writing transistor so that a potential is supplied to a node where a source electrode of the writing transistor, one electrode of the capacitor, and a gate electrode of the reading transistor are electrically connected, and then turning off the writing transistor so that a predetermined amount of electric charge is held in the node. In a holding period, the memory cell is brought into a selected state and a source electrode and a drain electrode of the reading transistor are set to the same potential, whereby the electric charge stored in the node is held.

8 Claims, 17 Drawing Sheets

U.S. PATENT DOCUMENTS

2011/0156028 A1 6/2011 Yamazaki et al.
2011/0156117 A1 6/2011 Yamazaki et al.
2011/0157961 A1 6/2011 Yamazaki et al.

OTHER PUBLICATIONS

Wonchan Kim et al.; "An Experimental High-Density DRAM Cell with a Built-in Gain Stage"; IEEE Journal of Solid-State Circuits; Aug. 1, 1994; vol. 29, No. 8; pp. 978-981.

Shoji Shukuri et al.; "A Complementary Gain Cell Technology for Sub-1 V Supply DRAMs"; IEDM 92: Technical Digest of International Electron Devices Meeting; Dec. 13, 1992; pp. 1006-1008.
Shoji Shukuri et al.; "A Semi-Static Complementary Gain Cell Technology for Sub-1 V Supply DRAM's"; IEEE Transactions on Electron Devices; Jun. 1, 1994; vol. 41, No. 6; pp. 926-931.

\* cited by examiner

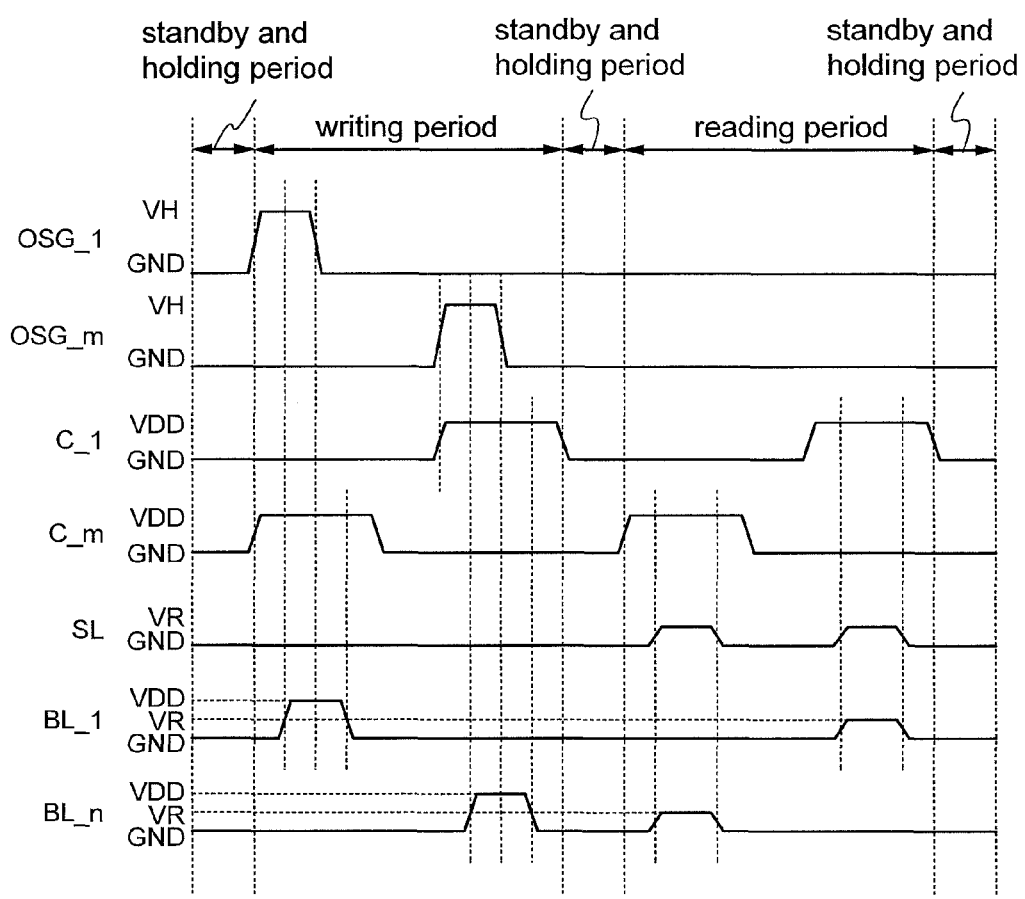

400   450a   437

450b

453

DRIVING METHOD OF SEMICONDUCTOR DEVICE

BACKGROUND OF THE INVENTION

1. Field of the Invention

An embodiment of the disclosed invention relates to a semiconductor device including a semiconductor element and a driving method of the semiconductor device.

2. Description of the Related Art

Storage devices including semiconductor elements are broadly classified into two categories: a volatile device that loses stored data when power is not supplied, and a non-volatile device that holds stored data even when power is not supplied.

A typical example of a volatile storage device is a DRAM (dynamic random access memory). A DRAM stores data in such a manner that a transistor included in a storage element is selected and electric charge is stored in a capacitor.

When data is read from a DRAM, electric charge in a capacitor is lost on the above-described principle; thus, another writing operation is necessary whenever data is read out. Moreover, for example, since leakage current (off-state current) flows between a source and a drain of a transistor included in a storage element when the transistor is in an off state, electric charge flows into or out even if the transistor is not selected, which makes a data holding period short. For that reason, another writing operation (refresh operation) is necessary at predetermined intervals, and it is difficult to sufficiently reduce power consumption. Furthermore, since stored data is lost when power is not supplied, an additional storage device using a magnetic material or an optical material is needed in order to hold data for a long time.

Another example of a volatile storage device is an SRAM (static random access memory). An SRAM holds stored data by using a circuit such as a flip-flop and thus does not need a refresh operation. This means that an SRAM has an advantage over a DRAM. However, cost per storage capacity is increased because a circuit such as a flip-flop is used. Moreover, as in a DRAM, stored data in an SRAM is lost when power is not supplied.

A typical example of a non-volatile storage device is a flash memory. A flash memory includes a floating gate between a gate electrode and a channel formation region in a transistor and stores data by holding electric charge in the floating gate. Therefore, a flash memory has advantages in that the data holding time is extremely long (almost permanent) and a refresh operation which is necessary in a volatile storage device is not needed (e.g., see Patent Document 1).

However, a gate insulating layer included in a storage element deteriorates by tunneling current generated in writing, so that the storage element stops its function after a predetermined number of writing operations. In order to reduce adverse effects of this problem, a method in which the number of writing operations for storage elements is equalized is employed, for example. However, a complicated peripheral circuit is needed to realize this method. Moreover, employing such a method does not solve the fundamental problem of lifetime. In other words, a flash memory is not suitable for applications in which data is frequently rewritten.

In addition, high voltage is necessary in order to inject electric charge into the floating gate or removing the electric charge, and a circuit therefor is required. Further, it takes a relatively long time to inject or remove electric charge, and it is not easy to increase the speed of writing and erasing of data.

REFERENCE

Patent Document

[Patent Document 1] Japanese Published Patent Application No. S57-105889

SUMMARY OF THE INVENTION

In view of the foregoing problems, it is an object of an embodiment of the disclosed invention to provide a semiconductor device with a novel structure in which stored data can be held even when power is not supplied, and which does not have a limitation on the number of writing operations.

In the disclosed invention, a semiconductor device is formed using a material which allows a sufficient reduction in off-state current of a transistor; for example, an oxide semiconductor material, which is a wide-gap semiconductor, is used. When a semiconductor material which allows a sufficient reduction in off-state current of a transistor is used, the semiconductor device can hold data for a long period.

Further, an embodiment of the disclosed invention provides a semiconductor device including a non-volatile memory cell including a writing transistor which includes an oxide semiconductor, a reading transistor which includes a semiconductor material different from that of the writing transistor, and a capacitor. Data is written or rewritten to the memory cell by turning on the writing transistor and supplying a potential to a node where one of a source electrode and a drain electrode of the writing transistor, one electrode of the capacitor, and a gate electrode of the reading transistor are electrically connected to each another, and then turning off the writing transistor so that a predetermined amount of electric charge is held in the node. In addition, in a holding period, the memory cell is brought into a selected state and a source electrode and a drain electrode of the reading transistor are set to the same potential, so that the electric charge stored in the node is held. Further, by using a p-channel transistor as the reading transistor, a reading operation is performed without using a negative potential.

Specifically, structures described below can be employed, for example.

An embodiment of the present invention is a method for driving a semiconductor device in which a source electrode of a first transistor and a source electrode of a second transistor are electrically connected to a bit line, a gate electrode of the second transistor is electrically connected to a write word line, a drain electrode of the first transistor is electrically connected to a source line, one electrode of a capacitor is electrically connected to a write-read word line, and a gate electrode of the first transistor, a drain electrode of the second transistor, and the other electrode of the capacitor are electrically connected to each other to form a node where electric charge is held. The method includes the steps of: supplying a potential at which the second transistor is turned on to the write word line and supplying a ground potential to the source line in a writing period, thereby storing electric charge in the node; and supplying a ground potential to the write word line and the write-read word line and supplying the same potential to the source line and the bit line in a holding period after the writing period, thereby holding the electric charge stored in the node.

Another embodiment of the present invention is a method for driving a semiconductor device comprising a bit line, a source line, a plurality of write word lines, a plurality of write-read word lines, and a memory cell array comprising a plurality of memory cells. In one of the plurality of memory cells, a source electrode of a first transistor and a source electrode of a second transistor are electrically connected to the bit line, a gate electrode of the second transistor is electrically connected to one of the plurality of write word lines, a drain electrode of the first transistor is electrically connected to the source line, one electrode of a capacitor is electrically connected to one of the plurality of write-read word line, and a gate electrode of the first transistor, a drain electrode of the second transistor, and the other electrode of the capacitor are electrically connected to each other to form a node where electric charge is held. The method includes the steps of: supplying a potential at which the second transistor in each of the plurality of memory cells is turned on to the plurality of write word lines and supplying a ground potential to the source line in a writing period, thereby storing electric charge in the node in each of the plurality of memory cells; supplying a ground potential to the plurality of write word lines and the plurality of write-read word lines and supplying the same potential to the bit line and the source line in a holding period after the writing period, thereby holding the electric charge stored in the node in each of the plurality of memory cells; and supplying a power supply potential to one of the plurality of write-read word lines connected to one of the plurality of memory cells in a non-selected state and supplying a ground potential to another one of the write-read word lines connected to another one of the plurality of memory cells in a selected state in a reading period, thereby reading the electric charge held in the node in the memory cell in the selected state.

In the method for driving a semiconductor device, a ground potential may be supplied to the source line and the bit line in the holding period.

Another embodiment of the present invention is a method for driving a semiconductor device comprising a plurality of bit lines, a source line, a plurality of write word lines, a plurality of write-read word lines, and a memory cell array comprising a plurality of memory cells. In one of the plurality of memory cells, a source electrode of a first transistor and a source electrode of a second transistor are electrically connected to one of the plurality of bit lines, a gate electrode of the second transistor is electrically connected to one of the plurality of write word lines, a drain electrode of the first transistor is electrically connected to the source line, one electrode of a capacitor is electrically connected to one of the plurality of write-read word lines, and a gate electrode of the first transistor, a drain electrode of the second transistor, and the other electrode of the capacitor are electrically connected to each other to form a node where electric charge is held. The method includes the steps of: supplying a potential at which the second transistor in each of the plurality of memory cells is turned on to the plurality of write word lines and supplying a ground potential to the source line in a writing period, thereby storing electric charge in the node in each of the plurality of memory cells; supplying a ground potential to the plurality of write word lines and the plurality of write-read word lines and supplying the same potential to the plurality of bit lines and the source line in a holding period after the writing period, thereby holding the electric charge stored in the node in each of the plurality of memory cells; and supplying a power supply potential to one of the plurality of write-read word lines connected to one of the plurality of memory cells in a non-selected state and supplying a ground potential to another one of the write-read word lines connected to another one of the plurality of memory cells in a selected state in a reading period, thereby reading the electric charge held in the node in the memory cell in the selected state.

In the method for driving a semiconductor device, a ground potential may be supplied to the source line and the plurality of bit lines in the holding period.

In the method for driving a semiconductor device, a channel formation region of the second transistor may include an oxide semiconductor.

Note that in this specification and the like, the term such as "over" or "below" does not necessarily mean that a component is placed "directly on" or "directly under" another component. For example, the expression "a gate electrode over a gate insulating layer" can mean the case where there is an additional component between the gate insulating layer and the gate electrode.

In addition, in this specification and the like, the term such as "electrode" or "wiring" does not limit a function of such a component. For example, an "electrode" is sometimes used as part of a "wiring", and vice versa. In addition, the term "electrode" or "wiring" can also mean a combination of a plurality of "electrodes" or "wirings", for example.

Functions of "source" and "drain" are sometimes replaced with each other when a transistor of opposite polarity is used or when the direction of current flowing is changed in circuit operation, for example. Therefore, the terms "source" and "drain" can be replaced with each other in this specification.

Note that in this specification and the like, the term "electrically connected" includes the case where components are connected through an object having any electric function. There is no particular limitation on an object having any electric function as long as electric signals can be transmitted and received between components that are connected through the object.

Examples of an object having any electric function are a switching element such as a transistor, a resistor, an inductor, a capacitor, and an element with a variety of functions as well as an electrode and a wiring.

Since the off-state current of a transistor including an oxide semiconductor is extremely small, stored data can be held for an extremely long time by using the transistor. In other words, power consumption can be adequately reduced because a refresh operation becomes unnecessary or the frequency of refresh operations can be extremely low. Moreover, stored data can be held for a long period even when power is not supplied (note that a potential is preferably fixed).

Further, a semiconductor device according to an embodiment of the disclosed invention does not need high voltage for writing of data and there is no problem of deterioration of elements. For example, unlike a conventional non-volatile memory, it is not necessary to inject and extract electrons into and from a floating gate, and thus a problem such as deterioration of a gate insulating layer does not occur at all. In other words, the semiconductor device according to an embodiment of the disclosed invention does not have a limitation on the number of times of writing operations which is a problem in a conventional non-volatile memory, and reliability is drastically improved. Furthermore, data is written depending on the on state and the off state of the transistor, whereby a high-speed operation can be easily realized. In addition, there is no need of an operation for erasing data.

When a transistor which includes a material other than an oxide semiconductor and can operate at sufficiently high speed is used as a reading transistor in combination with a transistor which includes an oxide semiconductor and is used as a writing transistor, a semiconductor device can perform an operation (e.g., a data reading operation) at sufficiently high speed. Further, with a transistor including a material other than an oxide semiconductor, a variety of circuits (such as a logic circuit and a driver circuit) which are required to operate at high speed can be favorably realized.

Thus, a semiconductor device having a novel feature can be realized by providing both a transistor including a material other than an oxide semiconductor and capable of an operation at sufficiently high speed and a transistor including an oxide semiconductor (more broadly, a transistor whose off-state current is sufficiently small).

BRIEF DESCRIPTION OF THE DRAWINGS

FIG. 3 is a timing chart.

DETAILED DESCRIPTION OF THE INVENTION

Figure 1A:
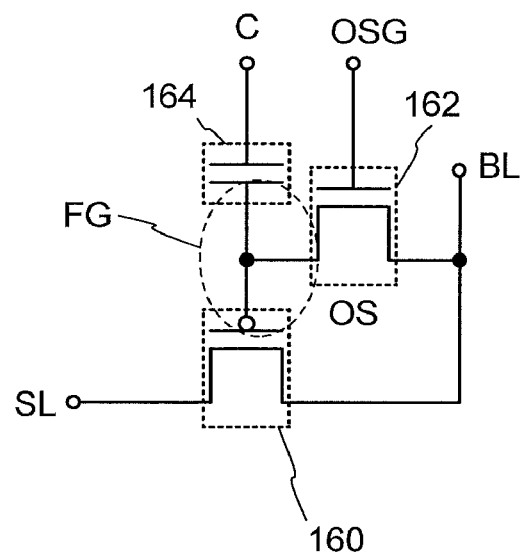
FIGS. 1A and 1B are circuit diagrams of a semiconductor device.

Embodiments of the present invention will be described with reference to the drawings. Note that the present invention is not limited to the following description and it will be readily appreciated by those skilled in the art that modes and details thereof can be modified in various ways without departing from the spirit and the scope of the present invention. Therefore, the present invention should not be construed as being limited to the following description of the embodiments.

Note that the position, the size, the range, or the like of each structure illustrated in drawings and the like is not accurately represented in some cases for easy understanding. Therefore, the disclosed invention is not necessarily limited to the position, the size, the range, or the like as disclosed in the drawings and the like.

In this specification and the like, ordinal numbers such as "first", "second", and "third" are used in order to avoid confusion among components, and the terms do not limit the components numerically.

Embodiment 1

In this embodiment, a basic circuit structure and an operation of a semiconductor device according to an embodiment of the disclosed invention will be described with reference to FIGS. 1A and 1B and FIGS. 2A and 2B. Note that in each of circuit diagrams, in some cases, "OS" is written beside a transistor in order to indicate that the transistor includes an oxide semiconductor.

<Basic Circuit 1>

First, the most basic circuit structure and its operation are described with reference to FIGS. 1A and 1B. In a semiconductor device illustrated in FIG. 1A, a bit line BL, a source electrode (or a drain electrode) of a transistor 160, and a source electrode (or a drain electrode) of a transistor 162 are electrically connected to each other; and a source line SL and the drain electrode (or the source electrode) of the transistor 160 are electrically connected to each other. In addition, a write word line OSG and a gate electrode of the transistor 162 are electrically connected to each other. A gate electrode of the transistor 160 and the drain electrode (or the source electrode) of the transistor 162 are electrically connected to one electrode of a capacitor 164. A write-read word line C and the other electrode of the capacitor 164 are electrically connected to each other. Note that the source electrode (or the drain electrode) of the transistor 160 and the source electrode (or the drain electrode) of the transistor 162 may be electrically connected to different wirings without being electrically connected to each other.

Here, a transistor including an oxide semiconductor is used as the transistor 162, for example. A transistor including an oxide semiconductor has a characteristic of a significantly small off-state current. For that reason, a potential of the gate electrode of the transistor 160 can be held for an extremely long time by turning off the transistor 162. Provision of the capacitor 164 facilitates holding of electric charge supplied to the gate electrode of the transistor 160 and reading of held data.

Note that there is no particular limitation on a semiconductor material of the transistor 160. In terms of increasing the speed of reading data, it is preferable to use, for example, a transistor with a high switching rate such as a transistor formed using single crystal silicon. Note that a p-channel transistor is used as the transistor 160.

The semiconductor device in FIG. 1A utilizes a characteristic with which the potential of the gate electrode of the transistor 160 can be held. With the use of the characteristic, data is written, held, and read as follows.

First, writing and holding of data are described. First, the potential of the write word line OSG is set to a potential which allows the transistor 162 to be turned on, so that the transistor 162 is turned on. Accordingly, the potential of the bit line BL is supplied to a node (also referred to as a node FG) where the drain electrode (or the source electrode) of the transistor 162, the gate electrode of the transistor 160, and one electrode of the capacitor 164 are electrically connected to each other. That is, a predetermined electric charge is supplied to the node FG (writing). Here, one of electric charges for supplying two different potentials (hereinafter, an electric charge for supplying a low potential is referred to as an electric charge $Q_L$ and an electric charge for supplying a high potential is referred to as an electric charge $Q_H$) is supplied to the node FG. Note that electric charges for supplying three or more different potentials may be supplied to improve storage capacity. After that, the potential of the write word line OSG is set to a potential which allows the transistor 162 to be turned off, so that the transistor 162 is turned off. Thus, the electric charge supplied to the node FG is held (holding).

Since the off-state current of the transistor 162 is significantly small, the electric charge of the gate electrode of the transistor 160 is held for a long time.

Next, reading of data is described. When an appropriate potential (a reading potential) is supplied to the write-read word line C with the source line SL supplied with a predetermined potential (a constant potential), the potential of the bit line BL varies depending on the amount of electric charge held in the node FG. That is, the conductance of the transistor 160 is controlled by the electric charge held in the gate electrode of the transistor 160 (which can also be referred to as the node FG).

In general, when the transistor 160 is a p-channel transistor, an apparent threshold voltage $V_{th\_H}$ in the case where $Q_H$ is supplied to the gate electrode of the transistor 160 is lower than an apparent threshold voltage $V_{th\_L}$ in the case where $Q_L$, is supplied to the gate electrode of the transistor 160. For example, in the case where $Q_L$ is supplied in writing, when the potential of the write-read word C becomes $V_0$ (a potential intermediate between $V_{th\_H}$ and $V_{th\_L}$), the transistor 160 is turned on. In the case where $Q_H$ is supplied in writing, even when the potential of the write-read word C becomes $V_0$, the transistor 160 remains off. Therefore, the stored data can be read by recognizing the potential of the bit line (BL).

Then, rewriting of data is described. Rewriting of data is performed in a manner similar to that of the writing and holding of data. In other words, the potential of the write word line OSG is set to a potential which allows the transistor 162 to be turned on, so that the transistor 162 is turned on. Accordingly, the potential of the bit line BL (a potential for new data) is supplied to the node FG. After that, the potential of the write word line OSG is set to a potential which allows the transistor 162 to be turned off, so that the transistor 162 is turned off. Accordingly, electric charge for new data is kept in the node FG.

In the semiconductor device according to an embodiment of the disclosed invention, data can be directly rewritten by another writing of data as described above. Therefore, extracting of electric charge from a floating gate with the use of high voltage needed in a flash memory or the like is not necessary, and reduction in operation speed, which is attributed to an erasing operation, can be suppressed. In other words, a high-speed operation of the semiconductor device can be realized.

As an example, writing, holding, and reading of data in the case where either a power supply potential $V_{DD}$ or a ground potential GND is supplied to the node FG are specifically described below. Hereinafter, data "1" is held when a power supply potential $V_{DD}$ is supplied to the node FG, whereas data "0" is held when a ground potential GND is supplied to the node FG. Note that the relation among potentials supplied to the node FG is not limited to this example.

In the case where data is written (in a writing period), the source line SL is set to GND, the write-read word line C is set to GND, and the write word line OSG is set to $V_{DD}$, so that the transistor 162 is turned on. Then, in the case where data "0" is written to the node FG, GND is supplied to the bit line BL. Note that in the case where data "1" is written to the node FG, the potential of the bit line BL may be set to $V_{DD}$ and the potential of the write word line OSG may be set to $V_{DD}+V_{th\_OS}$ in order to prevent the potential of the node FG from being decreased by the threshold voltage ($V_{th\_OS}$) of the transistor 162.

In the case where data is held (in a holding period) or the memory cell is brought into a standby state (in a standby period), the write word line OSG is set to GND, so that the transistor 162 is turned off. In addition, in order to reduce the voltage between the drain and the source of the transistor 162 (hereinafter $V_{ds\_OS}$), the write-read word line C is set to GND. Note that, by setting the write-read word line C to GND, current flows in the bit line BL and the source line SL through the transistor 160 that is a p-channel transistor. Therefore, by setting the bit line BL and the source line SL to the same potential, the voltage between the drain and the source of the transistor 160 (hereinafter $V_{ds\_p}$) is 0 V, whereby current flowing between the bit line BL and the source line SL is suppressed.

Note that in the above description, "the same potential" includes "substantially the same potential". That is, the purpose of the above operation lies in that the voltage between the bit line BL and the source line SL is sufficiently reduced to reduce current flowing between the bit line BL and the source line SL; therefore, "the same potential" includes "substantially the same potential", for example, a potential which allows power consumption to be sufficiently reduced (to less than or equal to one hundredth) compared to the case where the potential of the source line SL is fixed to GND or the like. In addition, potential deviation due to wiring resistance or the like is reasonably acceptable.

In order to suppress voltage stress on the transistor 162, the bit line BL and the source line SL are preferably set to GND in a holding period and a standby period.

When the write-read word line C is set to GND in a holding period and a standby period, $V_{ds\_OS}$ can be reduced. For example, when data "1" (i.e., $V_{DD}$) is written to the node FG in a writing period and the write-read word line C is set to $V_{DD}$ in a holding period, the potential of the node FG is increased by $V_{DD}$ through capacitive coupling and becomes $2V_{DD}$. In this case, when the potential of the bit line BL is set to GND, $V_{ds\_OS}$ becomes $2V_{DD}$ (=$2V_{DD}$–GND). On the other hand, when the write-read word line C is set to GND in a holding period under conditions similar to the above, the potential of the node FG becomes $V_{DD}$, and when the bit line BL is set to GND, $V_{ds\_OS}$ becomes $V_{DD}$ (=$V_{DD}$–GND), whereby $V_{ds\_OS}$ can be more reduced than in the case where the write-read word line C is set to $V_{DD}$. By reducing $V_{ds\_OS}$, the off-state current of the transistor 162 can be further reduced, whereby the holding characteristics of the memory cell can be further improved.

In the case where data is read out (in a reading period), the write word line OSG is set to GND, the write-read word line C is set to GND, and the source line SL is set to $V_{DD}$ or a potential which is slightly lower than $V_{DD}$ (hereinafter, referred to as $V_R$). Here, in the case where data "1" has been written to the node FG, the transistor 160 that is a p-channel transistor is turned off, and the potential of the bit line BL is maintained at the level of the beginning of reading or is decreased. Note that it depends on a reading circuit connected to the bit line BL whether the potential of the bit line BL is maintained or decreased. Further, in the case where data "0" has been written to the node FG, the transistor 160 is turned on, and the potential of the bit line BL becomes $V_{DD}$ which is equal to the potential of the source line SL or $V_R$. Thus, data "1" or data "0" held in the node FG can be read out by recognizing the potential of the bit line BL.

Note that in the case where a potential $V_{DD}$ is held in the node FG (that is, data "1" has been written to the node FG), when the potential of the source line SL is set to $V_{DD}$ at the time of reading, the voltage between the gate and the source of the transistor 160 (hereinafter, referred to as $V_{gs\_p}$) becomes 0 V ($V_{DD}$–$V_{DD}$=0 V), so that $V_{gs\_p}$ is higher than the threshold voltage of the transistor 160 (hereinafter, referred to as $V_{th\_p}$); thus, the transistor 160 that is a p-channel transistor is turned off. Here, even in the case where the potential held in the node FG is lower than $V_{DD}$ because, for example, the potential written to the node FG is lower than $V_{DD}$, as long as the potential of the node FG is higher than or equal to $V_{DD}$–

$|V_{th\_p}|$, the equation, $V_{gs\_p}=(V_{DD}-|V_{th\_p}|)-V_{DD}=-|V_{th\_p}|=V_{th\_p}$, is satisfied and the transistor 160 is turned off; thus, data "1" can be read correctly. However, in the case where the potential of the node FG is lower than $V_{DD}-|V_{th\_p}|$, $V_{gs\_p}$ is lower than $V_{th\_p}$; thus, the transistor 160 is turned on and not data "1" but data "0" is read, which is incorrect data reading. In other words, in the case where data "1" has been written, the lowest potential which can be read is $V_{DD}-|V_{th\_p}|$ which is lower than the potential $V_{DD}$ of the source line SL by $|V_{th\_p}|$. In contrast, when the potential of the source line SL is set to $V_R$ at the time of reading, the lowest potential which allows data "1" to be read out is $V_R-|V_{th\_p}|$ which is lower than the potential $V_R$ of the source line SL by $|V_{th\_p}|$, as described above. Here, since $V_R$ is lower than $V_{DD}$, $V_R-|V_{th\_p}|$ is lower than $V_{DD}-|V_{th\_p}|$. In other words, the lowest potential which allows data to be read out in the case where the potential of the source line SL is set to $V_R$ is lower than that in the case where the potential of the source line SL is set to $V_{DD}$. Thus, setting the potential of the source line SL to $V_R$ is preferable to setting the potential to $V_{DD}$, in which case the range of the potential which allows reading of data "1" can be widened. As for the highest potential which allows data to be read out, in the case where the potential of the source line SL is set to $V_R$, $V_{gs\_p}$ in the case where $V_{DD}$ has been written to the node FG is $V_{DD}-V_R>V_{th\_p}$ (because of $V_{DD}>V_R$); thus, the transistor 160 can be turned off without any problem.

Here, the drain electrode (or the source electrode) of the transistor 162, the gate electrode of the transistor 160, and one electrode of the capacitor 164 are electrically connected to each other to form the node (FG) which has a function similar to that of a floating gate of a floating gate transistor used for a non-volatile memory element. When the transistor 162 is off, the node FG can be regarded as being embedded in an insulator and electric charge is held in the node FG. The off-state current of the transistor 162 including an oxide semiconductor is less than or equal to one hundred thousandth of the off-state current of a transistor including a silicon semiconductor or the like; thus, loss of the electric charge stored in the node FG due to leakage current of the transistor 162 is negligible. That is, with the transistor 162 including an oxide semiconductor, a non-volatile storage device which can hold data without being supplied with power can be realized.

For example, when the off-state current of the transistor 162 is less than or equal to 10 zA (1 zA (zeptoampere) is $1 \times 10^{-21}$ A) at room temperature (25° C.) and the capacitance value of the capacitor 164 is approximately 10 fF, data can be held for at least greater than or equal to $10^4$ seconds. It is needless to say that the holding time depends on transistor characteristics and the capacitance value.

In the semiconductor device of the disclosed invention, a problem of deterioration of a gate insulating film (a tunnel insulating film), which occurs in a conventional floating gate transistor, does not exist. That is, the deterioration of a gate insulating film due to injection of electrons into a floating gate, which has been traditionally regarded as a problem, can be solved. This means that there is no limitation on the number of times of writing operations in principle. Furthermore, high voltage needed for writing or erasing of data in a conventional floating gate transistor is not necessary.

Figure 1B:
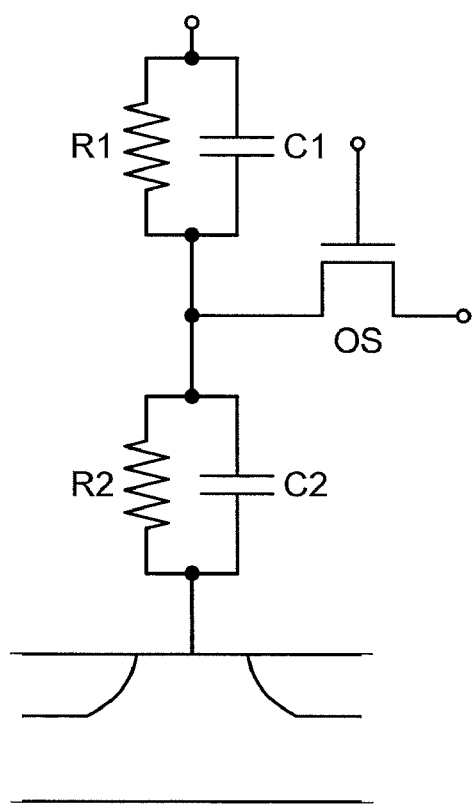

The components such as transistors included in the semiconductor device in FIG. 1A can each be regarded as including a resistor and a capacitor as illustrated in FIG. 1B. That is, in FIG. 1B, the transistor 160 and the capacitor 164 are each regarded as including a resistor and a capacitor. R1 and C1 denote the resistance value and the capacitance value of the capacitor 164, respectively. The resistance value R1 corresponds to the resistance value which depends on an insulating layer included in the capacitor 164. R2 and C2 denote the resistance value and the capacitance value of the transistor 160, respectively. The resistance value R2 corresponds to the resistance value which depends on a gate insulating layer at the time when the transistor 160 is on. The capacitance C2 corresponds to the capacitance value of a so-called gate capacitance (capacitance formed between the gate electrode and the source or drain electrode, and capacitance formed between the gate electrode and the channel formation region).

An electric charge holding period (also referred to as a data holding period) is determined mainly by the off-state current of the transistor 162 under the conditions where the gate leakage current of the transistor 162 is sufficiently small and R1 and R2 satisfy R1≧ROS and R2≧ROS, respectively, where ROS is the resistance value (also referred to as an effective resistance value) between the source electrode and the drain electrode in a state where the transistor 162 is turned off.

On the other hand, when the above conditions are not met, it is difficult to sufficiently secure the holding period even if the off-state current of the transistor 162 is sufficiently small. This is because a leakage current other than the off-state current of the transistor 162 (e.g., a leakage current generated between the source electrode and the gate electrode) is large. Accordingly, it can be said that it is preferable that the semiconductor device disclosed in this embodiment satisfy the above relations of R1≧ROS and R2≧ROS.

It is desirable that C1≧C2 be satisfied. This is because by increasing C1, the potential of the write-read word line C can be effectively supplied to the node FG when the potential in the node FG is controlled by the write-read word line C, and thus, the difference between the potentials supplied to the write-read word line C (e.g., a potential for reading and a potential for non-reading) can be reduced.

As described above, when the above relation is satisfied, a more favorable semiconductor device can be realized. Note that R1 and R2 are controlled by the gate insulating layer of the transistor 160 and the insulating layer of the capacitor 164. This also applies to C1 and C2. Therefore, the material, the thickness, and the like of the gate insulating layer are desirably set as appropriate to satisfy the above relation.

In the semiconductor device described in this embodiment, the node FG has a function similar to that of a floating gate of a floating gate transistor in a flash memory or the like, but the node FG of this embodiment has a feature which is essentially different from that of the floating gate in the flash memory or the like.

In a flash memory, since a potential applied to a control gate is high, it is necessary to keep a proper distance between cells in order to prevent the potential from affecting a floating gate of the adjacent cell. This is one of inhibiting factors for higher integration of the semiconductor device. This factor is attributed to a basic principle of a flash memory, in which a tunneling current is generated by applying a high electric field.

In contrast, the semiconductor device according to this embodiment is operated by switching of the transistor including an oxide semiconductor and does not use the above-described principle of electric charge injection by tunneling current. That is, a high electric field for electric charge injection is not necessary unlike a flash memory. Accordingly, it is not necessary to consider an influence of a high electric field from a control gate on the adjacent cell; therefore, higher integration can be easily achieved.

In addition, the semiconductor device according to the disclosed invention is advantageous over a flash memory in that a high electric field is not necessary and a large peripheral circuit (such as a step-up circuit) is not necessary. For example, the highest voltage applied to the memory cell according to this embodiment (the difference between the highest potential and the lowest potential applied to terminals of the memory cell at the same time) can be less than or equal to 5 V, preferably less than or equal to 3 V in each memory cell in the case where two levels (one bit) of data are written.

In the case where the relative dielectric constant ∈r1 of the insulating layer included in the capacitor 164 is made different from the relative dielectric constant ∈r2 of the insulating layer included in the transistor 160, C1 and C2 can easily satisfy C1≧C2 while S1 which is the area of the insulating layer included in the capacitor 164 and S2 which is the area of the insulating layer forming gate capacitance of the transistor 160 satisfy 2 S2≧S1 (desirably S2≧S1). That is, it is easy to satisfy C1≧C2 while the area of the insulating layer included in the capacitor 164 is made small. Specifically, for example, a film formed of a high-k material such as hafnium oxide or a stack of a film formed of a high-k material such as hafnium oxide and a film formed of an oxide semiconductor is used for the insulating layer included in the capacitor 164 so that ∈r1 can be set to greater than or equal to 10, preferably greater than or equal to 15, and silicon oxide is used for the insulating layer forming the gate capacitance of the transistor 160 so that ∈r2 can be set to 3 to 4.

Combination of such structures enables higher integration of the semiconductor device according to the disclosed invention.

<Basic Circuit 2>

Figure 2A:
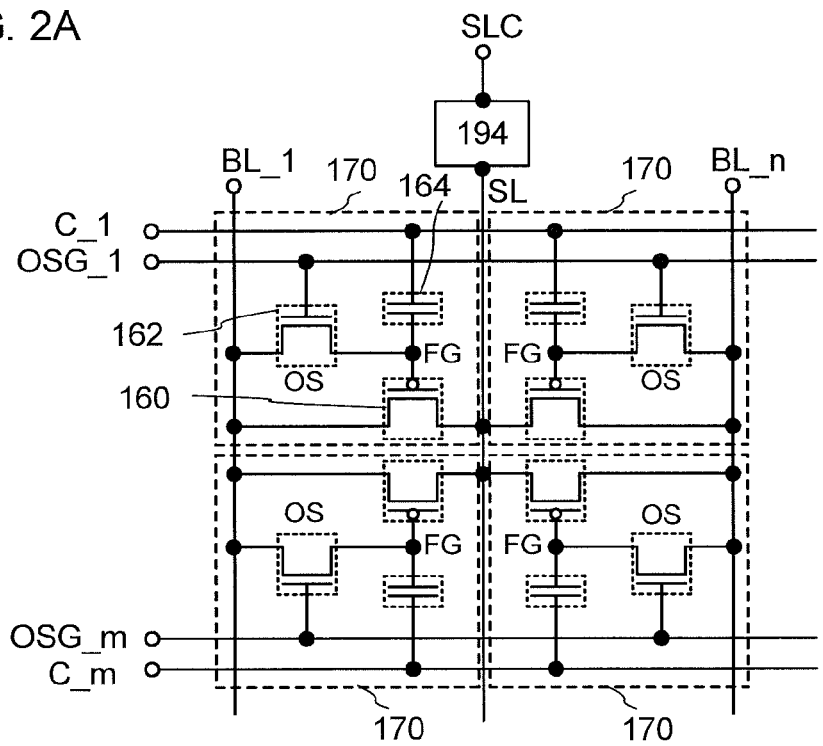
FIGS. 2A and 2B are each a circuit diagram of a semiconductor device.
Figure 2B:
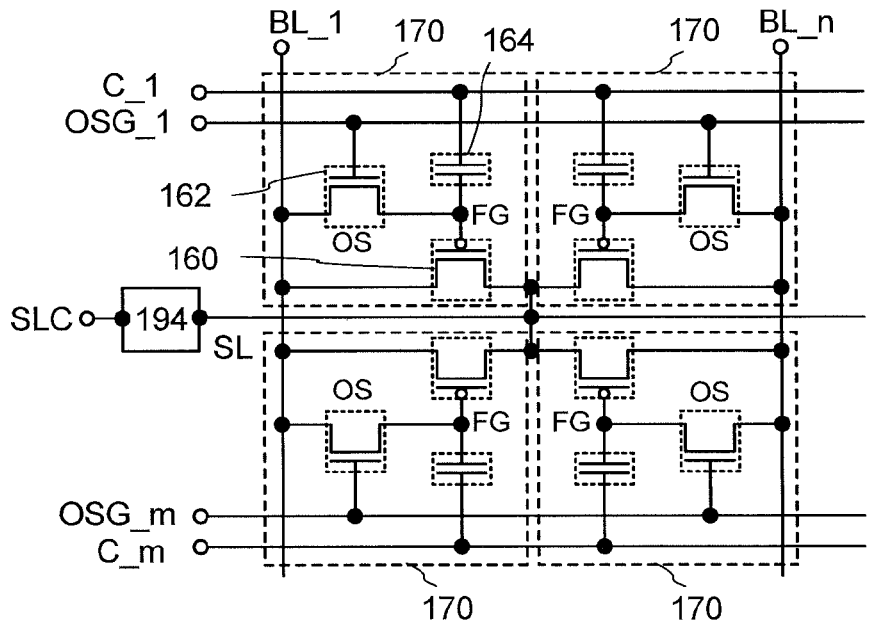

FIGS. 2A and 2B are circuit diagrams of memory cell arrays in each of which the memory cells illustrated in FIG. 1A are arranged in a matrix of two rows and two columns The structures of memory cells 170 in FIGS. 2A and 2B are similar to that in FIG. 1A. Note that the memory cells in two columns share the source line SL in FIG. 2A, and the memory cells in two rows share the source line SL in FIG. 2B.

When memory cells in two columns or two rows share the source line SL as in FIG. 2A or 2B, the number of signal lines connected to the memory cells 170 can be reduced to 3.5 (3+½) from 4 that is the number of signal lines in the case where the source line SL is not shared.

Note that without limitation to two columns (or two rows), memory cells in plural columns (or plural rows) such as three or more columns (or three or more rows) may share the source line SL. The number of columns (or rows) which share the source line SL may be determined as appropriate in consideration of parasitic resistance and parasitic capacitance generated when the source line SL is shared. Further, the number of columns (or rows) which share the source line SL is preferably large, in which case the number of signal lines connected to the memory cells 170 can be reduced.

In FIGS. 2A and 2B, the source line SL is connected to a source line switching circuit 194. Here, the source line switching circuit 194 is connected to a source line switching signal line SLC in addition to the source line SL.

In the semiconductor devices illustrated in FIGS. 2A and 2B, writing, holding, and reading of data are performed in a manner similar to that in the case of FIGS. 1A and 1B; therefore, the above description can be referred to. Note that a writing operation, for example, in the case where either a power supply potential $V_{DD}$ or a ground potential GND is supplied to the node FG and in the case where data held at the time when a power supply potential $V_{DD}$ is supplied to the node FG is data "1" and data held at the time when a ground potential GND is supplied to the node FG is data "0" is specifically described below. First, the potential of the write-read word line C connected to the memory cell 170 is set to GND and the potential of the write word line OSG connected to the memory cell 170 is set to $V_{DD}$, so that the memory cell 170 is selected. Accordingly, the potential of the bit line BL is supplied to the node FG of the selected memory cell 170.

Here, in the case where a ground potential GND is supplied to the node FG (i.e., in the case where data "0" is held), a potential which allows the transistor 160 that is a p-channel transistor to be turned on is supplied to the gate electrode of the transistor 160. In that case, the potential of the source line SL needs to be set to a ground potential GND in order to suppress an increase in potential written to the node FG due to current flowing in the bit line BL and the source line SL.

Thus, a signal path in the source line switching circuit 194 is switched with a signal of the source line switching signal line SLC to supply a ground potential GND to the source line SL.

The operation is characterized in that the potential of the source line SL is set to a ground potential GND in a writing period. This can suppress generation of current flowing in the bit line BL and the source line SL even when a potential which allows the transistor 160 to be turned on is supplied to the node FG.

In the case where the memory cells 170 are arrayed as in FIGS. 2A and 2B, it is necessary to read out data only from the intended memory cell 170 in a reading period. In order to read out data only from the predetermined memory cell 170 and not to read out data from the other memory cells 170 as described above, the memory cells 170 from which data is not read out need to be in a non-selected state.

For example, as described in <Basic Circuit 1>, in the case where either a power supply potential $V_{DD}$ or a ground potential GND is supplied to the node FG and in the case where data held at the time when a power supply potential $V_{DD}$ is supplied to the node FG is data "1" and data held at the time when a ground potential GND is supplied to the node FG is data "0", the source line SL is set to GND, the write-read word line C is set to $V_{DD}$, and the write word line OSG is set to GND, so that the memory cell 170 can be brought into a non-selected state.

When the write-read word line C is set to $V_{DD}$, the potential of the node FG is increased by $V_{DD}$ due to capacitive coupling with the capacitor 164. In the case where $V_{DD}$ corresponding to data "1" has been written to the node FG, the potential of the node FG is increased by $V_{DD}$ to be $2V_{DD}$ ($V_{DD}$+$V_{DD}$=$2V_{DD}$) and $V_{gs\_p}$ is higher than $V_{th\_p}$; accordingly, the transistor 160 that is a p-channel transistor is turned off. In contrast, in the case where GND corresponding to data "0" has been written to the node FG, the potential of the node FG is increased by $V_{DD}$ to be $V_{DD}$ (GND+$V_{DD}$=$V_{DD}$) and $V_{gs\_p}$ is higher than $V_{th\_p}$; accordingly, the transistor 160 that is a p-channel transistor is turned off. That is, by setting the write-read word line C to $V_{DD}$, the transistor 160 can be turned off, that is, the memory cell 170 can be brought into a non-selected state regardless of data held in the node FG.

Note that if n-channel transistors are used as the transistors 160 for reading, in the case where the potentials of the gate electrodes of the n-channel transistors are higher than the threshold voltage of the transistors, not all memory cells can be turned off even by setting the write-read word line C to 0 V. Thus, a negative potential needs to be supplied to the write-read word line C in a non-selected row in order to bring the memory cells into a non-selected state. In contrast, in the semiconductor device described in this embodiment, p-channel transistors are used as the transistors for reading. Thus, memory cells in a non-selected row can be turned off by setting the write-read word line C in a non-selected row to a positive potential. Accordingly, a circuit generating a negative potential does not need to be provided for the memory cell. As a result, power consumption can be reduced and the semiconductor device can be downsized.

In addition, as described above, in the semiconductor device described in this embodiment, the write-read word line C is set to GND and the bit line BL and the source line SL are set to the same potential, preferably, GND in the holding period and the standby period. By setting the write-read word line C to GND, all the memory cells connected to the write-read word line C are in a selected state; however, since the bit line BL and the source line SL are set to the same potential, $V_{ds\_p}$ becomes 0 V, so that current can be prevented from flowing in the bit line BL and the source line SL. As described above, in the holding period, by setting the write-read word line C to GND, $V_{ds\_OS}$ can be reduced and the off-state current of the transistor 162 can be further reduced, whereby the holding characteristics of the memory cell can be further improved.

FIG. 3 is an example of a timing chart for the writing, holding, and reading operations of the semiconductor device in FIGS. 2A and 2B. OSG, C, and the like in the timing chart denote the wirings to which the potentials in the timing chart are supplied. Wirings having a similar function are distinguished by "_1", "_m", "_n" and the like added to the end of their names Note that the disclosed invention is not limited to the arrangement described below.

FIG. 3 shows the relation among the potentials of the wirings in the case where data "1" is written to the memory cell in the first row and the first column, data "0" is written to the memory cell in the first row and the n-th column, data "0" is written to the memory cell in the m-th row and the first column, and data "1" is written to the memory cell in the m-th row and the n-th column in the memory cells in m rows and n columns (m and n are each an integer of greater than or equal to 2), and then the written data in all the above memory cells is read out after the holding period.

In the standby period, the write word line OSG is set to be GND and the write-read word line C is set to GND. In addition, all the bit lines BL and source lines SL are set to the same potential. In FIG. 3, the bit line BL and the source line SL are set to GND.

In the writing period, first, the write word line OSG in a selected row is set to a potential (high potential: $V_H$) higher than a power supply potential $V_{DD}$, the write-read word line C in a selected row is set to GND, the write word line OSG in a non-selected row is set to GND, and the write-read word line C in a non-selected row is set to $V_{DD}$, so that a row on which writing is performed is selected.

In order to prevent a potential written to the node FG of the memory cell 170 from being decreased by the threshold voltage of the transistor 162 ($V_{th\_OS}$), the potential of the write word line OSG should be set higher than the sum of the potential of the bit line BL and $V_{th\_OS}$. Thus, for example, when $V_{DD}$ is written to the node FG (that is, when data "1" is written), $V_H$ is set higher than or equal to ($V_{DD}+V_{th\_OS}$). When no problem arises even though the potential written to the node FG is decreased by $V_{th\_OS}$, the potential of the write word line OSG in a selected row may be set to $V_{DD}$.

Then, at a timing later than the selection timing of a row on which writing is performed, data is input from the bit line BL to the memory cell. For example, when data "1" is written, $V_{DD}$ is supplied to the bit line BL; when data "0" is written, GND is input to the bit line BL.

In the semiconductor device described in this embodiment, in the holding period and the standby period, all the write-read word lines C connected to the memory cells are set to GND in a selected state; therefore, when data is input from the bit line BL to the memory cells at a timing earlier than the selection timing of a row on which writing is performed, current flows in the bit line BL and the source line SL via the transistors 160 in some cases. For example, when data "1" is written to the memory cell in which data "0" has been held in the node FG, since the potential of the write-read word line C is GND in the holding period, the potential of the node FG is GND. When the potential of the bit line BL becomes $V_{DD}$ at a timing earlier than the selection timing of a row on which writing is performed, $V_{gs\_p}$ becomes $-V_{DD}$, so that the transistor 160 that is a p-channel transistor is turned on. In addition, since the potential of the source line SL is GND, $V_{ds\_p}$ becomes $V_{DD}$, so that current flows between the drain and the source of the transistor 160 (between the bit line BL and the source line SL). Therefore, by making the timing of inputting data from the bit line BL to the memory cell (the timing at which the potential of the bit line BL is increased to $V_{DD}$) later than the selection timing of a row on which writing is performed (the timing at which the potential of the write word line OSG is increased to $V_H$), current flowing in the bit line BL and the source line SL can be suppressed.

Then, the write word line OSG is set to GND, and the bit line BL is set to GND at a timing later than the timing at which the write word line OSG is set to GND. This is because when the timing at which the bit line BL is set to GND is earlier, incorrect writing of data to the memory cell might be caused.

Finally, at a timing later than the timing at which the bit line BL is set to GND, the write-read word lines C in all the rows are set to GND, so that all the memory cells are in a selected state. When the write-read word lines C are set to GND at a timing earlier than the timing at which the bit line BL is set to GND, current flows between the drain and the source of the transistor 160 in some cases, as described above.

In the case where a ground potential GND is supplied to the node FG in the writing period, the source line SL is set to a ground potential GND in order to suppress current flowing in the bit line BL and the source line SL. This driving is performed by switching the signal path in the source line switching circuit 194 with a signal from the source line switching signal line SLC.

In the holding period, each wiring has the same potential as that in the standby period.

In the reading period, first, the write-read word line C in a selected row is set to GND, and the write-read word line C in a non-selected row is set to $V_{DD}$, so that a row on which reading is performed is selected. The write word line OSG is set to GND regardless of a selected state or a non-selected state.

Then, the source line SL is set to $V_{DD}$ or $V_R$ at a timing later than the to selection timing of a row on which reading is performed. As described above, in the semiconductor device described in this embodiment, in the holding period and the standby period, all the write-read word lines C connected to the memory cells are set to GND in a selected state; therefore, when the potential of the source line SL is increased to $V_{DD}$ or $V_R$ at a timing earlier than the selection timing of a row on which reading is performed, current flows in the bit line BL and the source line SL via the transistor 160 in some cases. For example, when data "0" is held in the node FG, since the write-read word line C is set to GND in the holding period, the potential of the node FG is GND. When the potential of the source line SL becomes $V_{DD}$ at a timing earlier than the selection timing of a row on which reading is performed, $V_{gs\_p}$ becomes $-V_{DD}$, so that the transistor 160 that is a p-channel transistor is turned on. In addition, since the potential of the bit line BL is GND, $V_{gs\_p}$ becomes $V_{DD}$, so that current flows between the drain and the source of the transistor 160 (between the bit line BL and the source line SL).

Therefore, by making the timing at which the potential of the source line SL is increased to $V_{DD}$ or $V_R$ later than the selection timing of a row on which reading is performed, current flowing in the bit line BL and the source line SL can be suppressed.

Finally, at a timing later than the timing at which the source line SL is set to GND, the write-read word line C is set to GND. When the write-read word line C is set to GND at a timing earlier than the timing at which the source line SL is set to GND, current flows between the drain and the source of the transistor 160 in some cases, as described above.

As described above, in the semiconductor devices having the circuit structures illustrated in FIGS. 2A and 2B, the area of the memory cell array can be reduced by sharing the source line SL by a plurality of columns (or a plurality of rows). Accordingly, the die size can be reduced. Moreover, the reduction in the die size allows cost reduction in manufacturing the semiconductor device or improvement in yield.

In addition, by using the driving method of a semiconductor device described in this embodiment, voltage between the drain and the source of the transistor 162 can be reduced in the standby period and the holding period. Accordingly, the leakage current (off-state current) of the transistor 162 can be further reduced, whereby the holding characteristics can be improved. By reducing the voltage between the drain and the source of the transistor 162 in the standby period and the holding period, voltage stress on the transistor 162 can be reduced, so that the reliability of the semiconductor device can be improved.

Application Example 1

Next, a more specific circuit structure to which the circuit illustrated in FIGS. 1A and 1B is applied will be described with reference to FIG. 4 and FIGS. 5A to 5D. Note that the case where an n-channel transistor is used as the writing transistor (the transistor 162) and a p-channel transistor is used as the reading transistor (the transistor 160) will be described below as an example. Note that in the circuit diagram illustrated in FIG. 4, wirings with slashes are wirings each including a plurality of signal lines.

Figure 4:
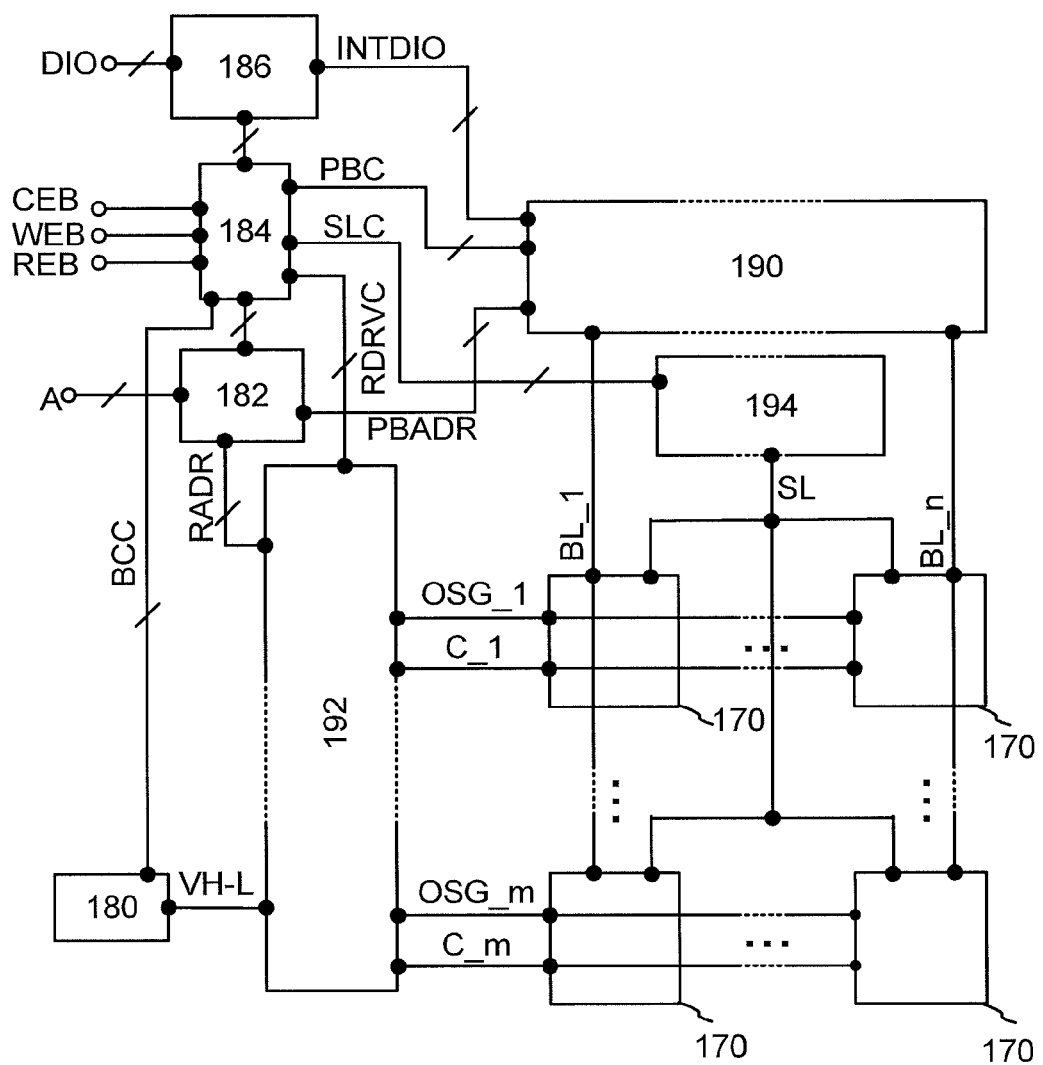
FIG. 4 is a circuit diagram of a semiconductor device.

FIG. 4 is an example of a circuit diagram of a semiconductor device including (m×n) memory cells 170. The structure of the memory cells 170 in FIG. 4 is similar to that in FIG. 1A.

The semiconductor device illustrated in FIG. 4 includes m (m is an integer of greater than or equal to 2) write word lines OSG; m write-read word lines C, n (n is an integer of greater than or equal to 2) bit lines BL, a source line SL, a memory cell array having the memory cells 170 arranged in a matrix of m (rows)×n (columns), a step-up circuit 180, a first driver circuit 182 including an address decoder, a second driver circuit 192 including a row driver, a third driver circuit 190 including a page buffer, a fourth driver circuit 184 including a controller, a fifth driver circuit 186 including an input-output control circuit, and the source line switching circuit 194. The number of driver circuits is not limited to the number in FIG. 4. Driver circuits having various functions may be combined or a driver circuit may be divided depending on functions.

In the semiconductor device illustrated in FIG. 4, the first driver circuit 182 includes an address decoder. The address decoder is a circuit which decodes an address selection signal from an address selection signal line A and outputs the decoded address selection signal to a row selection signal line RADR and a page buffer address selection signal line PBADR. The address selection signal line A corresponds to a terminal to which a row address selection signal of the memory cells 170 and a page buffer address selection signal are input. One or more address selection signal lines A are provided depending on the numbers of columns and rows of the memory cells 170 or the structure of the page buffer. The row selection signal line RADR is a signal line which specifies the row address of memory cells. The page buffer address selection signal line PBADR is a signal line which specifies the page buffer address.

The second driver circuit 192 includes a row driver. The row driver outputs a row selection signal of the memory cells 170, a signal to the write word line OSG, and a signal to the write-read word line C on the basis of a signal from the row selection signal line RADR output from the address decoder included in the first driver circuit 182.

The step-up circuit 180 is connected to the second driver circuit 192 through a wiring VH-L and is configured to step up a constant potential (e.g., a power supply potential $V_{DD}$) which is input to the step-up circuit 180 and to output a high potential ($V_H$) higher than the constant potential to the second driver circuit 192. In order to prevent a potential written to the node FG of the memory cell 170 from being decreased by the threshold voltage of the transistor 162 that is a writing transistor ($V_{th\_OS}$), the potential of the write word line OSG should be set higher than the sum of the potential of the bit line BL and $V_{th\_OS}$. Thus, for example, when the power supply potential $V_{DD}$ is written to the node FG, $V_H$ is set higher than or equal to ($V_{DD}+V_{th\_OS}$). Note that if a decrease in the potential written to the node FG by $V_{th\_OS}$ does not cause any problem, the step-up circuit 180 is not necessarily provided.

The third driver circuit 190 includes a page buffer. The page buffer functions as both a data latch and a sense amplifier. The page buffer functions as a data latch as follows: the page buffer temporarily stores data output from an internal data input-output signal line INTDIO or the bit line BL and outputs the stored data to the internal data input-output signal line INTDIO or the bit line BL. The page buffer functions as a sense amplifier as follows: the page buffer senses the bit line BL to which data is output from the memory cell when data is read.

The fourth driver circuit 184 is a circuit which includes a controller and generates signals for controlling the first driver circuit 182, the second driver circuit 192, the third driver circuit 190, the fifth driver circuit 186, the source line switching circuit 194, and the step-up circuit 180, with a signal form a chip-enable bar signal line CEB, a write-enable bar signal line WEB, or a read-enable bar signal line REB.

The chip-enable bar signal line CEB is a signal line for outputting a selection signal for the entire circuit, and accepts an input signal and outputs an output signal only when it is active. The write-enable bar signal line WEB is a signal line for outputting a signal which allows latch data of the page buffer in the third driver circuit 190 to be written to the memory cell array. The read-enable bar signal line REB is a signal line for outputting a signal which allows data of the memory cell array to be read out. The fourth driver circuit 184 is connected to the step-up circuit 180 through a step-up circuit control signal line BCC. The step-up circuit control signal line BCC is a wiring for transmitting a control signal of the step-up circuit which is output from the controller in the fourth driver circuit 184. No step-up circuit control signal line BCC or plural step-up circuit control signal lines BCC are provided depending on the circuit structure. In addition, the fourth driver circuit 184 is connected to the third driver circuit 190 through a page buffer control signal line PBC. The page buffer control signal line PBC is a wiring for transmitting a control signal of the page buffer which is output from the controller in the fourth driver circuit 184. No page buffer control signal line PBC or plural page buffer control signal lines PBC are provided depending on the circuit structure. In addition, the fourth driver circuit 184 is connected to the second driver circuit 192 through a row driver control signal line RDRVC. In addition, the fourth driver circuit 184 is connected to the source line switching circuit 194 through the source line switching signal line SLC.

A delay circuit is provided in the fourth driver circuit 184. The delay circuit is preferably connected to the page buffer control signal line PBC, the row driver control signal line RDRVC, and the source line switching signal line SLC. For example, by connecting the delay circuit to the page buffer control signal line PBC and supplying a delay signal to the page buffer control signal line PBC, the timing of change in potential of the bit line BL can be delayed. In addition, by connecting the delay circuit to the row driver control signal line RDRVC and supplying a delay signal to the row driver control signal line RDRVC, the timing of change in potential of the write-read word line C can be delayed. In addition, by connecting the delay circuit to the source line switching signal line SLC and supplying a delay signal to the source line switching signal line SLC, the timing of change in potential of the source line SL can be delayed. Through the above, incorrect writing to the memory cell 170 can be suppressed.

The source line switching circuit 194 is a circuit which switches the potential of the source line SL on the basis of a source line switching signal from the controller in the fourth driver circuit 184. The source line switching circuit 194 may have a function of switching the potential of the source line SL, and a multiplexer, an inverter, or the like may be used. The source line switching signal line SLC is a wiring for transmitting a signal which is for switching the potential of the source line SL and is output from the controller in the fourth driver circuit 184. One or more signal lines are provided depending on the circuit structure.

The fifth driver circuit 186 includes an input-output control circuit. The input-output control circuit is a circuit for outputting an input signal from a data input-output signal line DIO to the internal data input-output signal line INTDIO or outputting an input signal from the internal data input-output signal line INTDIO to the data input-output signal line DIO. A terminal of the data input-output signal line DIO is a terminal to which external data is input or from which memory data is output to the outside. One or more signal lines are provided depending on the circuit structure. The internal data input-output signal line INTDIO is a signal line for inputting an output signal from the input-output control circuit to the page buffer or inputting an output signal from the page buffer to the input-output control circuit. One or more signal lines are provided depending on the circuit structure. Further, the data input-output signal line DIO may be divided into a data input signal line and a data output signal line.

Figure 5A:
FIGS. 5A to 5D are each a circuit diagram of a semiconductor device.
Figure 5B:
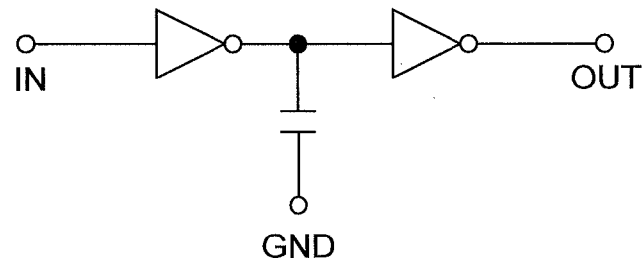
Figure 5C:
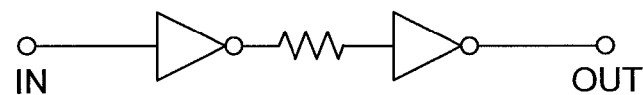
Figure 5D:
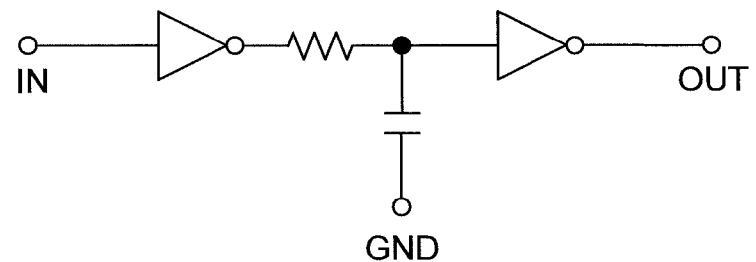

As the delay circuit provided in the fourth driver circuit 184, a circuit in which an even number of inverters are connected in series as illustrated in FIG. 5A can be used. Alternatively, the delay circuit may have a structure in which a capacitor is added to an even number of inverters connected in series as illustrated in FIG. 5B or a structure in which a resistor is added to an even number of inverters connected in series as illustrated in FIG. 5C. Still alternatively, the delay circuit may have a structure in which a resistor and a capacitor are added to an even number of inverter circuits connected in series as illustrated in FIG. 5D. The structure of the delay circuit is not limited to the above.

As described above, in the semiconductor device having the circuit structure illustrated in FIG. 4, the area of the memory cell array can be reduced by sharing the source line SL by plural columns (or plural rows). Accordingly, the die size can be reduced. Moreover, the reduction in the die size allows cost reduction in manufacturing the semiconductor device or improvement in yield.

Note that the operation method, the operation voltage, and the like relating to the semiconductor device of an embodiment of the disclosed invention are not limited to the above description and can be changed appropriately in accordance with an embodiment in which the operation of the semiconductor device is implemented.

The structures, methods, and the like described in this embodiment can be combined as appropriate with any of the structures, methods, and the like described in the other embodiments.

Embodiment 2

In this embodiment, a structure and a manufacturing method of a semiconductor device according to an embodiment of the disclosed invention will be described with reference to FIGS. 6A and 6B, FIGS. 7A to 7G, FIGS. 8A to 8E, FIGS. 9A to 9D, FIGS. 10A to 10D, and FIGS. 11A to 11C.
<Cross-Sectional Structure and Planar Structure of Semiconductor Device>

Figure 6A:
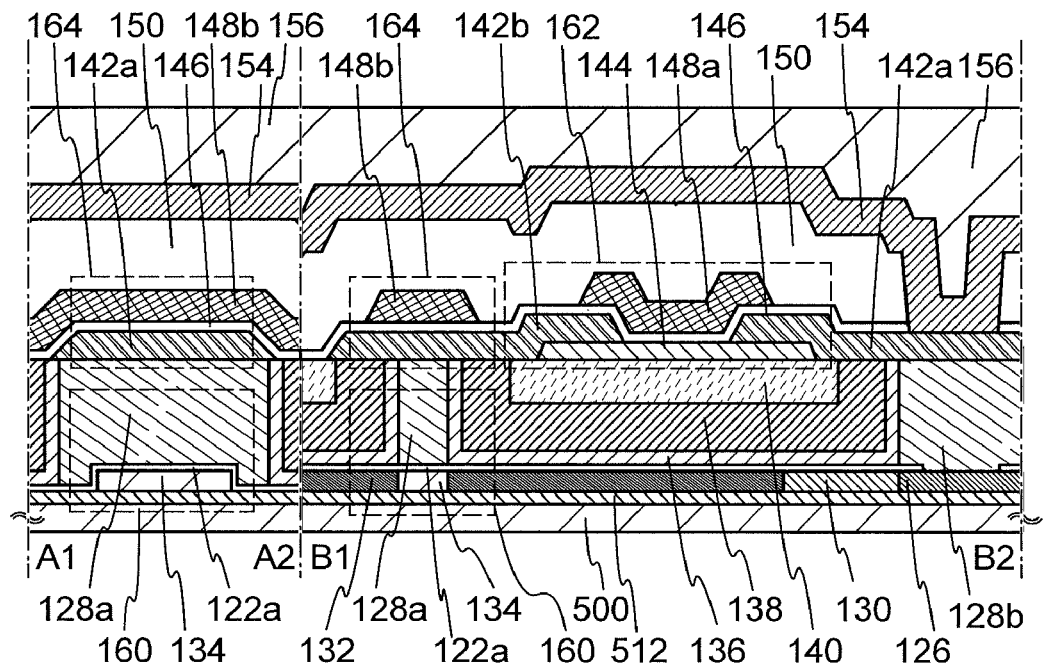
FIGS. 6A and 6B are a cross-sectional view and a plan view of a semiconductor device.
Figure 6B:
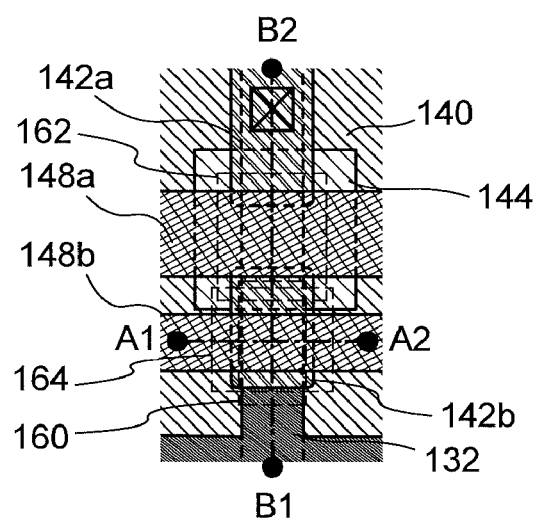

FIGS. 6A and 6B illustrate one example of a structure of the semiconductor device. FIG. 6A is a cross-sectional view of the semiconductor device, and FIG. 6B is a plan view of the semiconductor device. Here, FIG. 6A corresponds to a cross-section taken along line A1-A2 and line B1-B2 of FIG. 6B. The semiconductor device illustrated in FIGS. 6A and 6B includes a transistor 160 including a first semiconductor material in a lower portion, and a transistor 162 including a second semiconductor material in an upper portion. Here, the first semiconductor material is preferably different from the second semiconductor material. For example, a semiconductor material other than an oxide semiconductor can be used as the first semiconductor material, and an oxide semiconductor can be used as the second semiconductor material. The semiconductor material other than an oxide semiconductor can be, for example, silicon, germanium, silicon germanium, silicon carbide, gallium arsenide, or the like and is preferably single crystal. Alternatively, an organic semiconductor material or the like may be used. A transistor including such a semiconductor material other than an oxide semiconductor can operate at high speed easily. On the other hand, a transistor including an oxide semiconductor can hold electric charge for a long time owing to its characteristics. The semiconductor device in FIGS. 6A and 6B can be used as a memory cell.

Since the technical nature of the disclosed invention is to use a semiconductor material with which off-state current can be sufficiently decreased, such as an oxide semiconductor, in the transistor 162 so that data can be held, it is not necessary to limit a specific structure of the semiconductor device, such as a material of the semiconductor device or a structure of the semiconductor device, to those described here.

The transistor 160 in FIGS. 6A and 6B includes a channel formation region 134 provided in a semiconductor layer over a semiconductor substrate 500, impurity regions 132 (also referred to as a source region and a drain region) with the channel formation region 134 provided therebetween, a gate insulating layer 122a provided over the channel formation region 134, and a gate electrode 128a provided over the gate insulating layer 122a so as to overlap with the channel formation region 134. Note that a transistor whose source electrode and drain electrode are not illustrated in a drawing may be referred to as a transistor for the sake of convenience. Further, in such a case, in description of a connection of a transistor, a source region and a source electrode are collectively referred to as a "source electrode," and a drain region and a drain electrode are collectively referred to as a "drain electrode". That is, in this specification, the term "source electrode" may include a source region.

Further, a conductive layer 128b is connected to an impurity region 126 provided in the semiconductor layer over the semiconductor substrate 500. Here, the conductive layer 128b functions as a source electrode or a drain electrode of the transistor 160. In addition, an impurity region 130 is provided between the impurity region 132 and the impurity region 126. Further, insulating layers 136, 138, and 140 are provided so as to cover the transistor 160. Note that for higher integration, it is preferable that, as in FIGS. 6A and 6B, the transistor 160 does not have a sidewall insulating layer. On the other hand, when importance is put on the characteristics of the transistor 160, sidewall insulating layers may be provided on side surfaces of the gate electrode 128a, and the impurity region 132 may include regions with different impurity concentrations.

The transistor 162 in FIGS. 6A and 6B includes an oxide semiconductor layer 144 which is provided over the insulating layer 140 and the like; a source electrode (or a drain electrode) 142a and a drain electrode (or a source electrode) 142b which are electrically connected to the oxide semiconductor layer 144; a gate insulating layer 146 which covers the oxide semiconductor layer 144, the source electrode 142a, and the drain electrode 142b; and a gate electrode 148a which is provided over the gate insulating layer 146 so as to overlap with the oxide semiconductor layer 144.

Here, it is preferable that the oxide semiconductor layer 144 be highly purified by sufficient removal of impurities such as hydrogen or sufficient supply of oxygen. Specifically, the hydrogen concentration in the oxide semiconductor layer 144 is lower than or equal to $5 \times 10^{19}$ atoms/cm$^3$, preferably lower than or equal to $5 \times 10^{18}$ atoms/cm$^3$, more preferably lower than or equal to $5 \times 10^{17}$ atoms/cm$^3$. Note that the hydrogen concentration in the oxide semiconductor layer 144 is measured by secondary ion mass spectrometry (SIMS). In the oxide semiconductor layer 144 which is highly purified by sufficiently reducing the concentration of hydrogen and in which defect levels in an energy gap due to oxygen deficiency are reduced by supplying a sufficient amount of oxygen, the carrier concentration is lower than $1 \times 10^{12}$/cm$^3$, preferably lower than $1 \times 10^{11}$/cm$^3$, more preferably lower than $1.45 \times 10^{10}$/cm$^3$. For example, the off-state current (here, current per micrometer (μm) of channel width) at room temperature (25° C.) is less than or equal to 100 zA (1 zA (zeptoampere) is $1 \times 10^{-21}$ A), preferably less than or equal to 10 zA. In this manner, by using an oxide semiconductor which is made to an i-type (intrinsic) oxide semiconductor or a substantially i-type oxide semiconductor, the transistor 162 which has extremely favorable off-state current characteristics can be obtained.

It is preferable that impurities such as an alkali metal and an alkaline earth metal be sufficiently removed from the oxide semiconductor layer 144. For example, in the oxide semiconductor layer 144, the sodium concentration is lower than or equal to $5 \times 10^{16}$ cm$^{-3}$, preferably lower than or equal to $1 \times 10^{16}$ cm$^{-3}$, more preferably lower than or equal to $1 \times 10^{15}$ cm$^{-3}$, the lithium concentration is lower than or equal to $5 \times 10^{15}$ cm$^{-3}$, preferably lower than or equal to $1 \times 10^{15}$ cm$^{-3}$, and the potassium concentration is lower than or equal to $5 \times 10^{15}$ cm$^{-3}$, preferably lower than or equal to $1 \times 10^{15}$ cm$^{-3}$. The sodium concentration, the lithium concentration, and the potassium concentration in the oxide semiconductor layer 144 are measured by secondary ion mass spectrometry (SIMS).

An alkali metal and an alkaline earth metal are adverse impurities for an oxide semiconductor and are preferably contained little. An alkali metal, in particular, Na diffuses into an oxide and becomes Na$^+$ when an insulating layer in contact with the oxide semiconductor layer is an oxide. In addition, Na cuts the bond between a metal and oxygen or enters the bond in the oxide semiconductor layer. As a result, transistor characteristics deteriorate (e.g., the transistor becomes normally-on (the shift of a threshold voltage to a negative side) or the mobility is decreased). In addition, this also causes variation in the characteristics. Such a problem becomes evident especially in the case where the hydrogen concentration in the oxide semiconductor layer is sufficiently low. Therefore, the concentration of an alkali metal is strongly required to set to the above value in the case where the hydrogen concentration in the oxide semiconductor layer is lower than or equal to $5 \times 10^{19}$ cm$^{-3}$, particularly lower than or equal to $5 \times 10^{18}$ cm$^{-3}$.

Note that although the transistor 162 in FIGS. 6A and 6B includes the oxide semiconductor layer 144 which is processed into an island shape in order to suppress leakage current between elements which is caused due to miniaturization, the oxide semiconductor layer 144 which is not processed into an island shape may be employed. In the case where the oxide semiconductor layer is not processed into an island shape, contamination of the oxide semiconductor layer 144 due to etching in the processing can be prevented.

A capacitor 164 in FIGS. 6A and 6B includes the drain electrode 142b, the gate insulating layer 146, and a conductive layer 148b. In other words, the drain electrode 142b functions as one electrode of the capacitor 164, and the conductive layer 148b functions as the other electrode of the capacitor 164. With such a structure, capacitance can be sufficiently secured. Further, insulating properties between the drain electrode 142b and the conductive layer 148b can be adequately secured by stacking the oxide semiconductor layer 144 and the gate insulating layer 146. Further alternatively, the capacitor 164 may be omitted in the case where a capacitor is not needed.

In this embodiment, the transistor 162 and the capacitor 164 are provided so as to overlap with the transistor 160 at least partly. By employing such a planar layout, higher integration can be realized. For example, given that the minimum feature size is F, the area of a memory cell can be 15F$^2$ to 25F$^2$.

An insulating layer 150 is provided over the transistor 162 and the capacitor 164. A wiring 154 is provided in an opening formed in the gate insulating layer 146 and the insulating layer 150. The wiring 154 connects one memory cell to another memory cell and functions as the bit line BL in the circuit diagram of FIGS. 2A and 2B. The wiring 154 is connected to the impurity region 126 through the source electrode 142a and the conductive layer 128b. Thus, the number of wirings can be reduced as compared to the case where the source region or the drain region in the transistor 160 and the source electrode 142a in the transistor 162 are connected to different wirings. Accordingly, the integration degree of the semiconductor device can be improved.

Since the conductive layer 128b is provided, a position where the impurity region 126 and the source electrode 142a are connected and a position where the source electrode 142a and the wiring 154 are connected can overlap with each other. With such a planar layout, the element area can be prevented from increasing due to contact regions. In other words, the degree of integration of the semiconductor device can be increased.

<Manufacturing Method of SOI Substrate>

Next, an example of a manufacturing method of an SOI substrate used for manufacturing the above-described semiconductor device will be described with reference to FIGS. 7A to 7G.

Figure 7A:
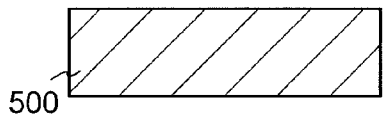
FIGS. 7A to 7G are cross-sectional views relating to manufacturing steps of a semiconductor device.
Figure 7B:
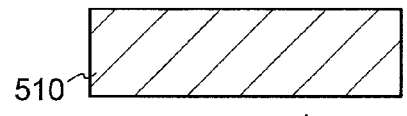

First, the semiconductor substrate 500 is prepared as a base substrate (see FIG. 7A). As the semiconductor substrate 500, a semiconductor substrate such as a single crystal silicon substrate or a single crystal germanium substrate can be used. In addition, as the semiconductor substrate, a solar grade silicon (SOG-Si) substrate or the like may be used. Alternatively, a polycrystalline semiconductor substrate may be used. In the case of using a SOG-Si substrate, a polycrystalline semiconductor substrate, or the like, manufacturing cost can be reduced as compared to the case of using a single crystal silicon substrate or the like.

Instead of the semiconductor substrate 500, a variety of glass substrates that are used in the electronics industry, such as aluminosilicate glass substrates, aluminoborosilicate glass substrates, and barium borosilicate glass substrates; quartz substrates; ceramic substrates; and sapphire substrates can be used. Further, a ceramic substrate which contains silicon nitride and aluminum oxide as its main components and whose coefficient of thermal expansion is close to that of silicon may be used.

A surface of the semiconductor substrate 500 is preferably cleaned in advance. Specifically, the semiconductor substrate 500 is preferably subjected to cleaning with a hydrochloric acid/hydrogen peroxide mixture (HPM), a sulfuric acid/hydrogen peroxide mixture (SPM), an ammonium hydrogen peroxide mixture (APM), diluted hydrofluoric acid (DHF), or the like.

Next, a bond substrate is prepared. Here, a single crystal semiconductor substrate 510 is used as the bond substrate (see FIG. 7B). Note that although a substrate whose crystallinity is single crystal is used as the bond substrate here, the crystallinity of the bond substrate is not necessarily limited to single crystal.

For example, as the single crystal semiconductor substrate 510, a single crystal semiconductor substrate formed using an element of Group 14, such as a single crystal silicon substrate, a single crystal germanium substrate, or a single crystal silicon germanium substrate, can be used. Further, a compound semiconductor substrate using gallium arsenide, indium phosphide, or the like can be used. Typical examples of commercially available silicon substrates are circular silicon substrates which are 5 inches (125 mm) in diameter, 6 inches (150 mm) in diameter, 8 inches (200 mm) in diameter, 12 inches (300 mm) in diameter, and 16 inches (400 mm) in diameter. Note that the shape of the single crystal semiconductor substrate 510 is not limited to circular, and the single crystal semiconductor substrate 510 may be a substrate which has been processed into, for example, a rectangular shape or the like. Further, the single crystal semiconductor substrate 510 can be formed by a Czochralski (CZ) method or a Floating Zone (FZ) method.

Figure 7C:
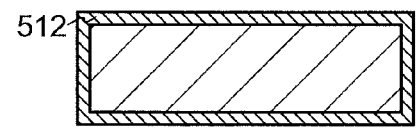

An oxide film 512 is formed on a surface of the single crystal semiconductor substrate 510 (see FIG. 7C). In view of removal of contamination, it is preferable that the surface of the single crystal semiconductor substrate 510 be cleaned with a hydrochloric acid/hydrogen peroxide mixture (HPM), a sulfuric acid/hydrogen peroxide mixture (SPM), an ammonium hydrogen peroxide mixture (APM), diluted hydrofluoric acid (DHF), FPM (a mixed solution of hydrofluoric acid, hydrogen peroxide water, and pure water), or the like before the formation of the oxide film 512. Alternatively, diluted hydrofluoric acid and ozone water may be discharged alternately to clean the surface of the single crystal semiconductor substrate 510.

The oxide film 512 can be formed with, for example, a single layer or a stacked layer of a silicon oxide film, a silicon oxynitride film, and the like. As a method for forming the oxide film 512, a thermal oxidation method, a CVD method, a sputtering method, or the like can be used. When the oxide film 512 is formed by a CVD method, a silicon oxide film is preferably formed using organosilane such as tetraethoxysilane (abbreviation: TEOS) (chemical formula: $Si(OC_2H_5)_4$), so that favorable bonding can be achieved.

In this embodiment, the oxide film 512 (here, a $SiO_x$ film) is formed by performing thermal oxidation treatment on the single crystal semiconductor substrate 510. The thermal oxidation treatment is preferably performed in an oxidizing atmosphere to which a halogen is added.

For example, thermal oxidation treatment of the single crystal semiconductor substrate 510 is performed in an oxidizing atmosphere to which chlorine (Cl) is added, whereby the oxide film 512 can be formed through chlorine oxidation. In this case, the oxide film 512 is a film containing chlorine atoms. By such chlorine oxidation, heavy metal (e.g., Fe, Cr, Ni, or Mo) that is an extrinsic impurity is trapped and chloride of the metal is formed and then removed to the outside; thus, contamination of the single crystal semiconductor substrate 510 can be reduced.

Note that the halogen atoms contained in the oxide film 512 are not limited to chlorine atoms. A fluorine atom may be contained in the oxide film 512. As a method for fluorine oxidation of the surface of the single crystal semiconductor substrate 510, a method in which the single crystal semiconductor substrate 510 is soaked in an BF solution and then subjected to thermal oxidation treatment in an oxidizing atmosphere, a method in which thermal oxidation treatment is performed in an oxidizing atmosphere to which $NF_3$ is added, or the like can be used.

Figure 7D:
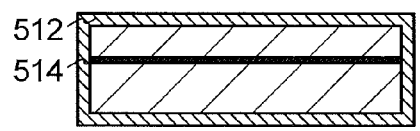
Figure 7E:
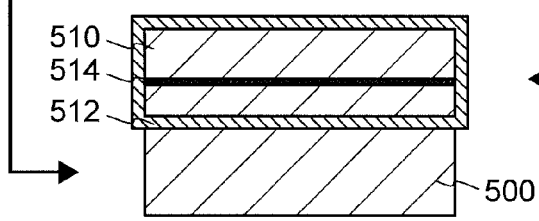

Next, ions are accelerated by an electric field and the single crystal semiconductor substrate 510 is irradiated with the ions, and the ions are added to the single crystal semiconductor substrate 510, whereby an embrittled region 514 where the crystal structure is damaged is formed in the single crystal semiconductor substrate 510 at a predetermined depth (see FIG. 7D).

The depth at which the embrittled region 514 is formed can be adjusted by the kinetic energy, mass, electric charge, or incidence angle of the ions, or the like. The embrittled region 514 is formed at approximately the same depth as the average penetration depth of the ions. Therefore, the thickness of a single crystal semiconductor layer to be separated from the single crystal semiconductor substrate 510 can be adjusted with the depth at which the ions are added. For example, the average penetration depth may be controlled such that the thickness of the single crystal semiconductor layer is approximately greater than or equal to 10 nm and less than or equal to 500 nm, preferably, greater than or equal to 50 nm and less than or equal to 200 nm.

The above ion irradiation treatment can be performed with an ion-doping apparatus or an ion-implantation apparatus. As a typical example of the ion-doping apparatus, there is a non-mass-separation type apparatus in which plasma excitation of a process gas is performed and an object to be processed is irradiated with all kinds of ion species generated. In this apparatus, the object to be processed is irradiated with ion species of plasma without mass separation. In contrast, an ion implantation apparatus is a mass-separation type apparatus. In the ion-implantation apparatus, mass separation of ion species of plasma is performed and the object to be processed is irradiated with ion species having predetermined masses.

In this embodiment, an example is described in which an ion doping apparatus is used to add hydrogen to the single crystal semiconductor substrate 510. A gas containing hydrogen is used as a source gas. As for ions used for the irradiation, the proportion of $H_3^+$ is preferably set high. Specifically, it is preferable that the proportion of $H_3^+$ be set higher than or equal to 50% (more preferably, higher than or equal to 80%) with respect to the total amount of $H^+$, $H_2^+$, and $H_3^+$. With a high proportion of $H_3^+$, the efficiency of ion irradiation can be improved.

Note that ions to be added are not limited to ions of hydrogen. Ions of helium or the like may be added. Further, ions to be added are not limited to one kind of ions, and plural kinds of ions may be added. For example, in the case of performing irradiation with hydrogen and helium concurrently using an ion-doping apparatus, the number of steps can be reduced as compared to the case of performing irradiation with hydrogen and helium in different steps, and surface roughness of a single crystal semiconductor layer to be formed later can be suppressed.

Note that heavy metal may also be added when the embrittled region 514 is formed with the ion-doping apparatus; however, when the ion irradiation is performed through the oxide film 512 containing halogen atoms, contamination of the single crystal semiconductor substrate 510 due to the heavy metal can be prevented.

Then, the semiconductor substrate 500 and the single crystal semiconductor substrate 510 are disposed to face each other and are closely attached to each other with the oxide film 512 therebetween. Thus, the semiconductor substrate 500 and the single crystal semiconductor substrate 510 are bonded to each other (see FIG. 7E). Note that an oxide film or a nitride film may be formed on the surface of the semiconductor substrate 500 to which the single crystal semiconductor substrate 510 is attached.

When bonding is performed, it is preferable that a pressure of higher than or equal to 0.001 N/cm² and lower than or equal to 100 N/cm², e.g., a pressure of higher than or equal to 1 N/cm² and lower than or equal to 20 N/cm², be applied to one part of the semiconductor substrate 500 or one part of the single crystal semiconductor substrate 510. When the bonding surfaces are made close to each other and firmly attached to each other by applying a pressure, a bonding between the semiconductor substrate 500 and the oxide film 512 is generated at the part where they are firmly attached to each other, and the bonding spontaneously spreads to almost the entire area. This bonding is performed under the action of the Van der Waals force or hydrogen bonding and can be performed at room temperature.

Note that before the single crystal semiconductor substrate 510 and the semiconductor substrate 500 are bonded to each other, surfaces to be bonded to each other are preferably subjected to surface treatment. Surface treatment can improve the bonding strength at the interface between the single crystal semiconductor substrate 510 and the semiconductor substrate 500.

As the surface treatment, wet treatment, dry treatment, or a combination of wet treatment and dry treatment can be used. Alternatively, wet treatment may be used in combination with different wet treatment or dry treatment may be used in combination with different dry treatment.

Note that heat treatment for increasing the bonding strength may be performed after bonding. This heat treatment is performed at a temperature at which separation at the embrittled region 514 does not occur (for example, a temperature of higher than or equal to room temperature and lower than 400° C.). Alternatively, the bonding of the semiconductor substrate 500 and the oxide film 512 may be performed while heating them at a temperature in this range. The heat treatment can be performed using a diffusion furnace, a heating furnace such as a resistance heating furnace, a rapid thermal annealing (RTA) apparatus, a microwave heating apparatus, or the like. The above temperature condition is merely an example, and an embodiment of the disclosed invention should not be construed as being limited to this example.

Figure 7F:
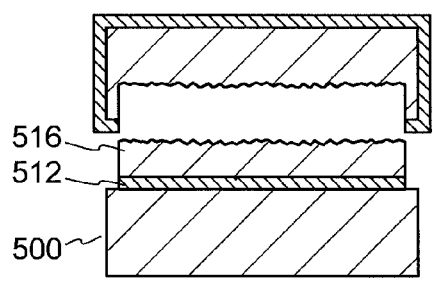

Next, heat treatment is performed for separation of the single crystal semiconductor substrate 510 at the embrittled region, whereby a single crystal semiconductor layer 516 is formed over the semiconductor substrate 500 with the oxide film 512 provided therebetween (see FIG. 7F).

Note that the temperature for heat treatment in the separation is desirably as low as possible. This is because as the temperature in the separation is low, generation of roughness on the surface of the single crystal semiconductor layer 516 can be suppressed. Specifically, the temperature for the heat treatment in the separation may be higher than or equal to 300. ° C. and lower than or equal to 600° C. and the heat treatment is more effective when the temperature is higher than or equal to 400° C. and lower than or equal to 500° C.

Note that after the single crystal semiconductor substrate 510 is separated, the single crystal semiconductor layer 516 may be subjected to heat treatment at higher than or equal to 500° C. so that concentration of hydrogen remaining in the single crystal semiconductor layer 516 is reduced.

Figure 7G:
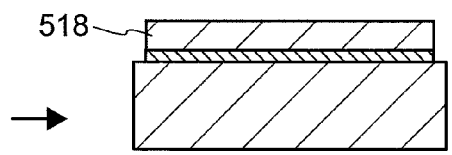

Then, the surface of the single crystal semiconductor layer 516 is irradiated with laser light, whereby a single crystal semiconductor layer 518 in which the planarity of the surface is improved and the number of defects is reduced is formed (see FIG. 7G). Note that instead of the laser light irradiation treatment, heat treatment may be performed.

Although the irradiation treatment with the laser light is performed immediately after the heat treatment for separation of the single crystal semiconductor layer 516 in this embodiment, an embodiment of the present invention is not construed as being limited to this. Etching treatment may be performed after the heat treatment for separation of the single crystal semiconductor layer 516, to remove a region where there are many defects on the surface of the single crystal semiconductor layer 516, and then the laser light irradiation treatment may be performed. Alternatively, after the surface planarity of the single crystal semiconductor layer 516 is improved, the laser light irradiation treatment may be performed. Note that the etching treatment may be either wet etching or dry etching. Further, in this embodiment, a step of reducing the thickness of the single crystal semiconductor layer 516 may be performed after the laser light irradiation. In order to reduce the thickness of the single crystal semiconductor layer 516, any one of or both dry etching and wet etching may be employed.

Through the above steps, an SOI substrate including the single crystal semiconductor layer 518 with favorable characteristics can be obtained (see FIG. 157G).

<Method for Manufacturing Semiconductor Device>

Next, a method for manufacturing a semiconductor device using the SOI substrate will be described with reference to FIGS. 8A to 8E, FIGS. 9A to 9D, FIGS. 10A to 10D, and FIGS. 11A to 11C.

<Method for Manufacturing Transistor in Lower Portion>

First, a manufacturing method of the transistor 160 in the lower portion will be described with reference to FIGS. 8A to 8E and FIGS. 9A to 9D. Note that FIGS. 8A to 8E and FIGS.

9A to 9D illustrate part of the SOI substrate formed by the method illustrated in FIGS. 7A to 7G and are cross-sectional views illustrating steps for forming the transistor in the lower portion illustrated in FIG. 6A.

Figure 8A:
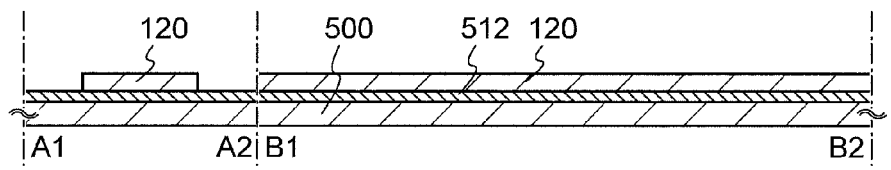
FIGS. 8A to 8E are cross-sectional views relating to manufacturing steps of a semiconductor device.

First, the single crystal semiconductor layer 518 is processed into an island shape, so that a semiconductor layer 120 is formed (see FIG. 8A). Note that before or after this step, an impurity element imparting n-type conductivity or an impurity element imparting p-type conductivity may be added to the semiconductor layer in order to control the threshold voltage of the transistor. In the case where silicon is used as the semiconductor, phosphorus, arsenic, or the like can be used as an impurity element imparting n-type conductivity. On the other hand, boron, aluminum, gallium, or the like can be used as an impurity element imparting p-type conductivity.

Figure 8B:
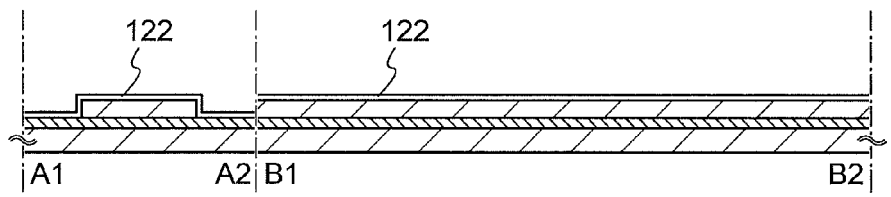

Next, an insulating layer 122 is formed so as to cover the semiconductor layer 120 (see FIG. 8B). The insulating layer 122 is to be a gate insulating layer. The insulating layer 122 can be formed, for example, by performing heat treatment (thermal oxidation treatment, thermal nitridation treatment, or the like) on a surface of the semiconductor layer 120. Instead of heat treatment, high-density plasma treatment may be employed. The high-density plasma treatment can be performed using, for example, a mixed gas of a rare gas such as He, Ar, Kr, or Xe and any of oxygen, nitrogen oxide, ammonia, nitrogen, and hydrogen. Needless to say, the insulating layer may be formed using a CVD method, a sputtering method, or the like. The insulating layer 122 preferably has a single-layer structure or a layered structure including one or more of silicon oxide, silicon oxynitride, silicon nitride, hafnium oxide, aluminum oxide, tantalum oxide, yttrium oxide, hafnium silicate (HfSi$_x$O$_y$ (x>0, y>0)), hafnium silicate (HfSi$_x$O$_y$ (x>0, y>0)) to which nitrogen is added, hafnium aluminate (HfAl$_x$O$_y$ (x>0, y>0)) to which nitrogen is added, and the like. The thickness of the insulating layer 122 may be, for example, greater than or equal to 1 nm and less than or equal to 100 nm, preferably greater than or equal to 10 nm and less than or equal to 50 nm. Here, a single-layer insulating layer containing silicon oxide is formed using a plasma CVD method.

Figure 8C:
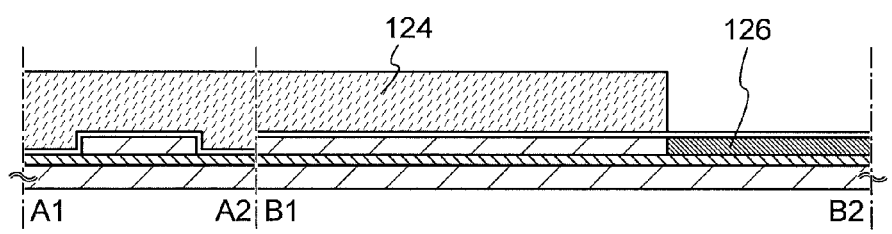

Next, a mask 124 is formed over the insulating layer 122 and an impurity element imparting one conductivity type is added to the semiconductor layer 120, so that the impurity region 126 is formed (see FIG. 8C). Note that here, the mask 124 is removed after the impurity element is added.

Figure 8D:
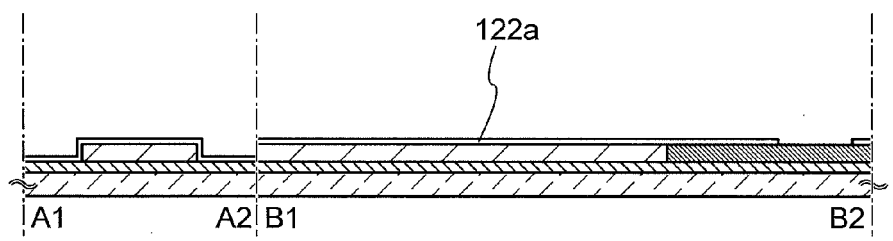

Next, a mask is formed over the insulating layer 122 and a region of the insulating layer 122 that overlaps with the impurity region 126 is partly removed, so that the gate insulating layer 122a is formed (see FIG. 8D). Part of the insulating layer 122 can be removed by etching treatment such as wet etching or dry etching.

Figure 8E:
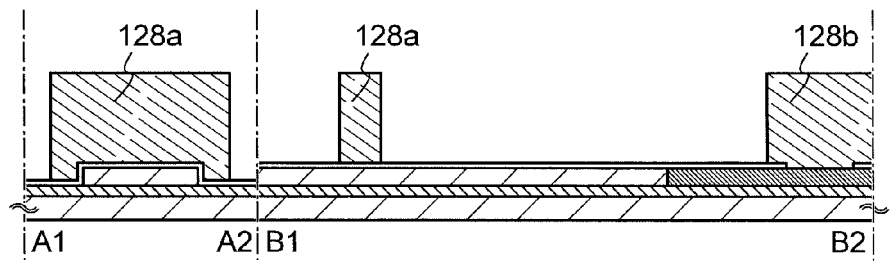

Next, a conductive layer used for forming a gate electrode (including a wiring formed using the same layer as the gate electrode) is framed over the gate insulating layer 122a and is processed, so that the gate electrode 128a and the conductive layer 128b are formed (see FIG. 8E).

The conductive layer used for the gate electrode 128a and the conductive layer 128b can be formed using a metal material such as aluminum, copper, titanium, tantalum, or tungsten. The conductive layer may also be formed using a semiconductor material such as polycrystalline silicon. There is no particular limitation on the method for forming the conductive layer, and a variety of film formation methods such as an evaporation method, a CVD method, a sputtering method, and a spin coating method can be employed. The conductive layer may be processed by etching using a resist mask.

Figure 9A:
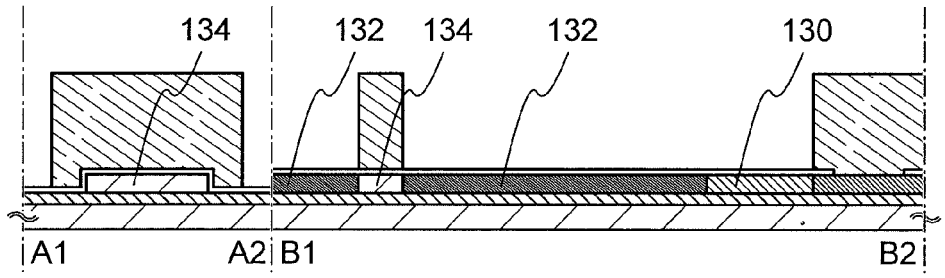
FIGS. 9A to 9D are cross-sectional views relating to manufacturing steps of a semiconductor device.

Next, an impurity element imparting one conductivity type is added to the semiconductor layer with the use of the gate electrode 128a and the conductive layer 128b as masks, so that the channel formation region 134, the impurity regions 132, and the impurity region 130 are formed (see FIG. 9A). Here, an impurity element such as boron (B) or aluminum (Al) is added in order to form a p-channel transistor. Here, the concentration of the impurity element to be added can be set as appropriate. In addition, after the impurity element is added, heat treatment for activation is performed. Here, the concentration of the impurity element in the impurity region is increased in the following order: the impurity region 126, the impurity region 132, and the impurity region 130.

Figure 9B:
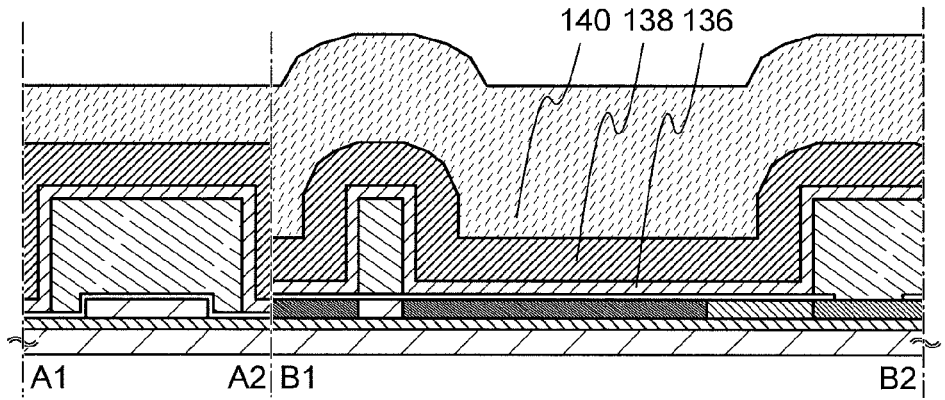

Next, the insulating layer 136, the insulating layer 138, and the insulating layer 140 are formed so as to cover the gate insulating layer 122a, the gate electrode 128a, and the conductive layer 128b (see FIG. 9B).

The insulating layer 136, the insulating layer 138, and the insulating layer 140 can be formed using a material including an inorganic insulating material such as silicon oxide, silicon oxynitride, silicon nitride oxide, silicon nitride, or aluminum oxide. The insulating layer 136, the insulating layer 138, and the insulating layer 140 are particularly preferably formed using a low-dielectric constant (low-k) material, because capacitance due to overlapping electrodes or wirings can be sufficiently reduced. Note that the insulating layer 136, the insulating layer 138, and the insulating layer 140 may be porous insulating layers formed using any of these materials. Since the porous insulating layer has a low dielectric constant as compared to a dense insulating layer, capacitance due to electrodes or wirings can be further reduced. Alternatively, the insulating layer 136, the insulating layer 138, and the insulating layer 140 can be formed using an organic insulating material such as polyimide or acrylic. In this embodiment, the case of using silicon oxynitride for the insulating layer 136, silicon nitride oxide for the insulating layer 138, and silicon oxide for the insulating layer 140 is described. A layered structure of the insulating layer 136, the insulating layer 138, and the insulating layer 140 is employed here; however, an embodiment of the disclosed invention is not limited to this. A single-layer structure, a layered structure of two layers, or a layered structure of four or more layers may be used.

Figure 9C:
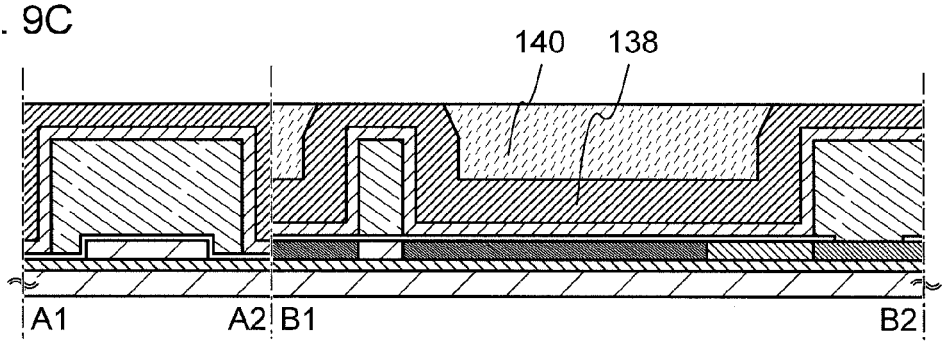

Next, the insulating layer 138 and the insulating layer 140 are subjected to chemical mechanical polishing (CMP) treatment, or etching treatment, so that the insulating layer 138 and the insulating layer 140 are flattened (see FIG. 9C). Here, CMP treatment is performed until the insulating layer 138 is partly exposed. When silicon nitride oxide is used for the insulating layer 138 and silicon oxide is used for the insulating layer 140, the insulating layer 138 functions as an etching stopper.

Figure 9D:
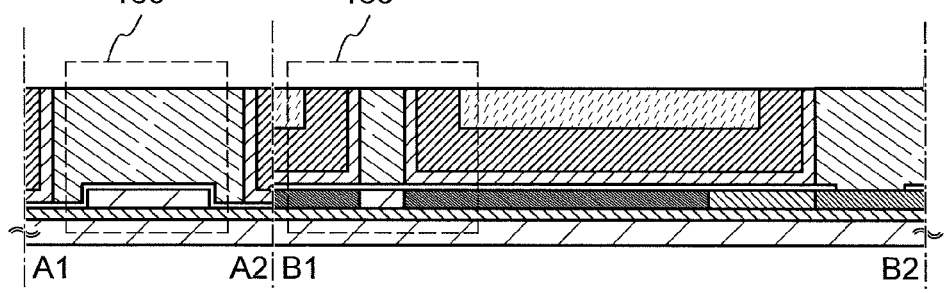

Next, the insulating layer 138 and the insulating layer 140 are subjected to CMP treatment, or etching treatment, so that upper surfaces of the gate electrode 128a and the conductive layer 128b are exposed (see FIG. 9D). Here, etching is performed until the gate electrode 128a and the conductive layer 128b are partly exposed. For the etching treatment, dry etching is preferably performed, but wet etching may be performed. In the step of partly exposing the gate electrode 128a and the conductive layer 128b, in order to improve the characteristics of the transistor 162 which is formed later, the surfaces of the insulating layer 136, the insulating layer 138, and the insulating layer 140 are preferably flattened as much as possible.

Through the above steps, the transistor 160 in the lower portion can be formed (see FIG. 9D).

Note that before or after the above steps, a step for forming an additional electrode, wiring, semiconductor layer, insulating layer, or the like may be performed. For example, a multilayer wiring structure in which an insulating layer and a conductive layer are stacked is employed as a wiring structure, so that a highly integrated semiconductor device can be provided.

<Method for Manufacturing Transistor in Upper Portion>

Next, a method for forming the transistor 162 in the upper portion will be described with reference to FIGS. 10A to 10D and FIGS. 11A to 11C.

Figure 10A:
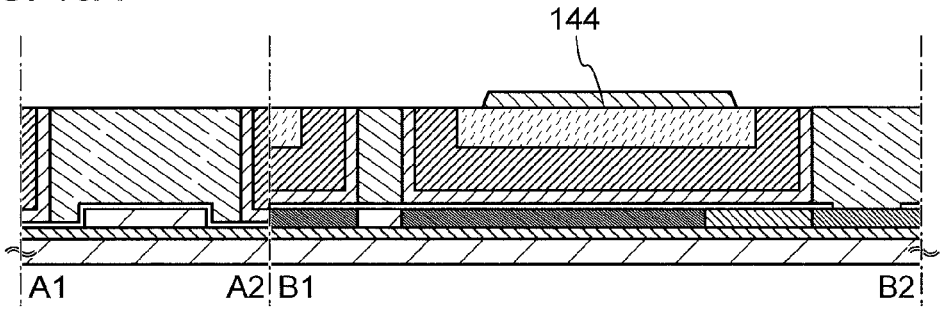
FIGS. 10A to 10D are cross-sectional views relating to manufacturing steps of a semiconductor device.

First, an oxide semiconductor layer is formed over the gate electrode 128*a*, the conductive layer 128*b*, the insulating layer 136, the insulating layer 138, the insulating layer 140, and the like and is processed, so that the oxide semiconductor layer 144 is formed (see FIG. 10A). Note that an insulating layer functioning as a base may be formed over the insulating layer 136, the insulating layer 138, and the insulating layer 140 before the oxide semiconductor layer is formed. The insulating layer can be formed by a PVD method such as a sputtering method, a CVD method such as a plasma CVD method, or the like.

As a material used for the oxide semiconductor layer, a four-component metal oxide material such as an In—Sn—Ga—Zn—O-based material; a three-component metal oxide material such as an In—Ga—Zn—O-based material, an In—Sn—Zn—O-based material, an In—Al—Zn—O-based material, a Sn—Ga—Zn—O-based material, an Al—Ga—Zn—O-based material, or a Sn—Al—Zn—O-based material; a two-component metal oxide material such as an In—Zn—O-based material, a Sn—Zn—O-based material, an Al—Zn—O-based material, a Zn—Mg—O-based material, a Sn—Mg—O-based material, an In—Mg—O-based material, or an In—Ga—O-based material; an In—O-based material; a Sn—O-based material; a Zn—O-based material; or the like can be used. In addition, the above materials may contain $SiO_2$. Here, for example, an In—Ga—Zn—O-based material means an oxide film containing indium (In), gallium (Ga), and zinc (Zn), and there is no particular limitation on the composition ratio. Further, the In—Ga—Zn—O-based material may contain an element other than In, Ga, and Zn.

As the oxide semiconductor layer, a thin film including a material expressed as the chemical formula, $InMO_3(ZnO)_m$ (m>0) can be used. Here, M represents one or more metal elements selected from Ga, Al, Mn, and Co. For example, M may be Ga, Ga and Al, Ga and Mn, Ga and Co, or the like.

The thickness of the oxide semiconductor layer is preferably greater than or equal to 3 nm and less than or equal to 30 nm. This is because the transistor might possibly be normally on when the oxide semiconductor layer is too thick (e.g., when the thickness is greater than or equal to 50 nm).

The oxide semiconductor layer is preferably formed by a method by which impurities such as hydrogen, water, a hydroxyl group, or hydride do not enter the oxide semiconductor layer. For example, a sputtering method or the like can be used.

In this embodiment, the oxide semiconductor layer is formed by a sputtering method with the use of an In—Ga—Zn—O-based oxide target.

As the In—Ga—Zn—O-based oxide target, for example, an oxide target having a composition ratio of $In_2O_3:Ga_2O_3:ZnO=1:1:1$ [molar ratio] can be used. Note that it is not necessary to limit the material and the composition of the target to the above. For example, an oxide target having a composition ratio of $In_2O_3:Ga_2O_3:ZnO=1:1:2$ [molar ratio] can be used.

In the case where an In—Zn—O-based material is used as the oxide semiconductor, a target therefor has a composition ratio of In:Zn=50:1 to 1:2 in an atomic ratio ($In_2O_3:ZnO=25:1$ to 1:4 in a molar ratio), preferably, In:Zn=20:1 to 1:1 in an atomic ratio ($In_2O_3:ZnO=10:1$ to 1:2 in a molar ratio), further preferably, In:Zn=15:1 to 1.5:1 in an atomic ratio ($In_2O_3:ZnO=15:2$ to 3:4 in a molar ratio). For example, as for a target used for formation of an In—Zn—O-based oxide semiconductor which has an atomic ratio of In:Zn:O=X:Y:Z, the relation of Z>1.5X+Y is satisfied.

The filling rate of the oxide target is higher than or equal to 90% and lower than or equal to 100%, preferably, higher than or equal to 95% and lower than or equal to 99.9%. With the use of the metal oxide target with a high filling rate, a dense oxide semiconductor layer can be formed.

The film formation atmosphere may be a rare gas (typically argon) atmosphere, an oxygen atmosphere, or a mixed atmosphere containing a rare gas and oxygen. An atmosphere of a high-purity gas from which impurities such as hydrogen, water, a hydroxyl group, or hydride are sufficiently removed is preferable, in order to prevent hydrogen, water, a hydroxyl group, hydride, or the like from entering the oxide semiconductor layer.

For example, the oxide semiconductor layer can be formed as follows.

First, the substrate is held in a film formation chamber which is kept under reduced pressure, and then is heated so that the substrate temperature reaches a temperature higher than 200° C. and lower than or equal to 500° C., preferably higher than 300° C. and lower than or equal to 500° C., more preferably higher than or equal to 350° C. and lower than or equal to 450° C.

Then, a high-purity gas from which impurities such as hydrogen, water, a hydroxyl group, or hydride are sufficiently removed is introduced into the film formation chamber from which remaining moisture is being removed, and the oxide semiconductor layer is formed over the substrate with the use of the target. To remove moisture remaining in the film formation chamber, an entrapment vacuum pump such as a cryopump, an ion pump, or a titanium sublimation pump is desirably used as an evacuation unit. Further, an evacuation unit may be a turbo pump provided with a cold trap. In the film formation chamber which is evacuated with the cryopump, for example, impurities such as hydrogen, water, a hydroxyl group, or hydride (preferably, also a compound containing a carbon atom) or the like are removed, whereby the concentration of impurities such as hydrogen, water, a hydroxyl group, or hydride in the oxide semiconductor layer formed in the film formation chamber can be reduced.

In the case where the substrate temperature is low (for example, lower than or equal to 100° C.) during film formation, a substance including a hydrogen atom may enter the oxide semiconductor; thus, it is preferable that the substrate be heated at a temperature in the above range. When the oxide semiconductor layer is formed with the substrate heated at the temperature in the above range, since the substrate temperature is high, hydrogen bonds are cut by heat and are less likely to be taken into the oxide semiconductor layer. Therefore, when the oxide semiconductor layer is formed with the substrate heated at the temperature in the above range, the concentration of impurities such as hydrogen, water, a hydroxyl group, or hydride in the oxide semiconductor layer can be sufficiently reduced. Moreover, damage due to sputtering can be reduced.

As an example of the film formation conditions, the following conditions can be employed: the distance between the substrate and the target is 60 mm, the pressure is 0.4 Pa, the direct-current (DC) power source is 0.5 kW, the substrate temperature is 400° C., and the film formation atmosphere is an oxygen atmosphere (the proportion of the oxygen flow rate is 100%). Note that a pulse direct current power source is preferable because powder substances (also referred to as particles or dust) generated in film formation can be reduced and the film thickness can be uniform.

Note that before the oxide semiconductor layer is formed by a sputtering method, powdery substances (also referred to as particles or dust) attached on a formation surface of the oxide semiconductor layer are preferably removed by reverse sputtering in which an argon gas is introduced and plasma is generated. The reverse sputtering refers to a method in which a voltage is applied to a substrate side to generate plasma in the vicinity of the substrate to modify a surface on the substrate side. Note that instead of argon, a gas of nitrogen, helium, oxygen, or the like may be used.

The oxide semiconductor layer can be processed by being etched after a mask having a desired shape is formed over the oxide semiconductor layer. The mask may be formed by a method such as photolithography or an ink jet method. For the etching of the oxide semiconductor layer, either dry etching or wet etching may be employed. It is needless to say that both of them may be employed in combination.

After that, heat treatment (first heat treatment) may be performed on the oxide semiconductor layer 144. The heat treatment eliminates substances including hydrogen atoms in the oxide semiconductor layer 144; thus, a structure of the oxide semiconductor layer 144 can be ordered and defect levels in energy gap can be reduced. The heat treatment is performed in an inert gas atmosphere at higher than or equal to 250° C. and lower than or equal to 700° C., preferably higher than or equal to 450° C. and lower than or equal to 600° C. or lower than a strain point of the substrate. The inert gas atmosphere is preferably an atmosphere which contains nitrogen or a rare gas (e.g., helium, neon, or argon) as its main component and does not contain water, hydrogen, or the like. For example, the purity of nitrogen or a rare gas such as helium, neon, or argon introduced into a heat treatment apparatus is higher than or equal to 6 N (99.9999%), preferably higher than or equal to 7 N (99.99999%) (that is, the concentration of the impurities is lower than or equal to 1 ppm, preferably lower than or equal to 0.1 ppm).

The heat treatment can be performed in such a way that, for example, the object to be processed is introduced into an electric furnace in which a resistance heating element or the like is used and heated, in a nitrogen atmosphere at 450° C. for an hour. The oxide semiconductor layer 144 is not exposed to the air during the heat treatment so that entry of water and hydrogen can be prevented.

The above heat treatment has an effect of removing hydrogen, water, and the like and thus can be referred to as dehydration treatment, dehydrogenation treatment, or the like. The heat treatment can be performed at the timing, for example, before the oxide semiconductor layer is processed to have an island shape, after the gate insulating film is formed, or the like. Such dehydration treatment or dehydrogenation treatment may be conducted once or plural times.

Figure 10B:
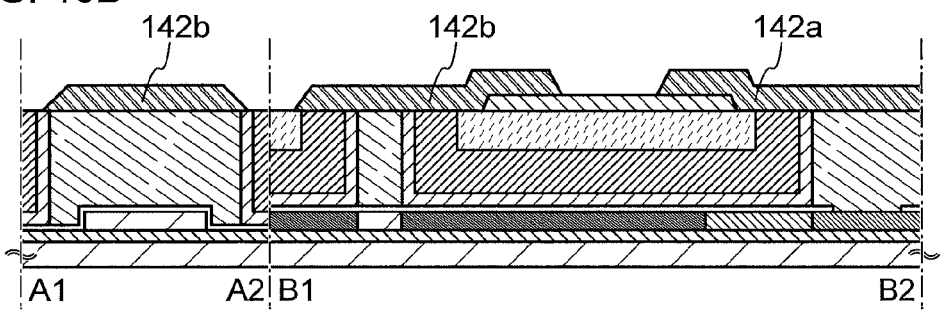

Next, a conductive layer to be a source electrode and a drain electrode (including a wiring formed using the same layer as the source electrode and the drain electrode) is formed over the oxide semiconductor layer 144 and the like and is processed, so that the source and drain electrodes 142a and 142b are formed (see FIG. 10B).

The conductive layer can be formed by a PVD method or a CVD method. As a material for the conductive layer, an element selected from aluminum, chromium, copper, tantalum, titanium, molybdenum, and tungsten; an alloy containing any of these elements as its component; or the like can be used. Further, one or more materials selected from manganese, magnesium, zirconium, beryllium, neodymium, and scandium in combination may be used.

The conductive layer can have a single-layer structure or a layered structure including two or more layers. For example, the conductive layer can have a single-layer structure of a titanium film or a titanium nitride film, a single-layer structure of an aluminum film containing silicon, a two-layer structure in which a titanium film is stacked over an aluminum film, a two-layer structure in which a titanium film is stacked over a titanium nitride film, or a three-layer structure in which a titanium film, an aluminum film, and a titanium film are stacked in this order. Note that the conductive layer having a single-layer structure of a titanium film or a titanium nitride film has an advantage in that it can be easily processed into the source electrode 142a and the drain electrode 142b having a tapered shape.

Alternatively, the conductive layer may be formed using conductive metal oxide. As the conductive metal oxide, indium oxide ($In_2O_3$), tin oxide ($SnO_2$), zinc oxide (ZnO), an alloy of indium oxide and tin oxide ($In_2O_3$—$SnO_2$, also abbreviated to ITO), an alloy of indium oxide and zinc oxide ($In_2O_3$—ZnO), or any of these metal oxide materials in which silicon or silicon oxide is included can be used.

The conductive layer is preferably etched so that end portions of the source electrode 142a and the drain electrode 142b that are to be formed are tapered. Here, a taper angle is, for example, preferably greater than or equal to 30° and less than or equal to 60°. The etching is performed so that the end portions of the source electrode 142a and the drain electrode 142b are tapered, whereby coverage with the gate insulating layer 146 formed later can be improved and disconnection can be prevented.

The channel length (L) of the transistor in the upper portion is determined by a distance between lower end portions of the source electrode 142a and the drain electrode 142b. Note that for light exposure for forming a mask used in the case where a transistor with a channel length (L) of less than 25 nm is formed, it is preferable to use extreme ultraviolet rays whose wavelength is as short as several nanometers to several tens of nanometers. In the light exposure by extreme ultraviolet rays, the resolution is high and the focus depth is large. For these reasons, the channel length (L) of the transistor to be formed later can be in the range of greater than or equal to 10 nm and less than or equal to 1000 nm (1 μm), and the circuit can operate at higher speed. Moreover, miniaturization can lead to lower power consumption of the semiconductor device.

Figure 10C:
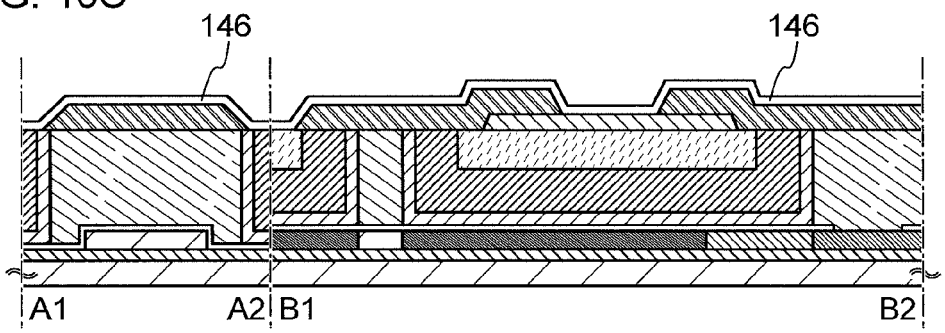

Next, the gate insulating layer 146 is formed so as to cover the source and drain electrodes 142a and 142b and to be in contact with part of the oxide semiconductor layer 144 (see FIG. 10C).

The gate insulating layer 146 can be formed by a CVD method, a sputtering method, or the like. The gate insulating layer 146 is preferably formed so as to contain silicon oxide, silicon nitride, silicon oxynitride, gallium oxide, aluminum oxide, tantalum oxide, hafnium oxide, yttrium oxide, hafnium silicate ($HfSi_xO_y$ (x>0, y>0)), hafnium silicate ($HfSi_xO_y$ (x>0, y>0)) to which nitrogen is added, hafnium aluminate ($HfAl_xO_y$ (x>0, y>0)) to which nitrogen is added, or the like. The gate insulating layer 146 may have a single-layer structure or a layered structure in which these materials are combined. There is no particular limitation on the thickness; however, in the case where the semiconductor device is miniaturized, the thickness is preferably small for ensuring operation of the transistor. For example, in the case where silicon oxide is used, the thickness can be set to greater than or equal to 1 nm and less than or equal to 100 nm, preferably greater than or equal to 10 nm and less than or equal to 50 nm.

When the gate insulating layer is thin as in the above description, a problem of gate leakage due to a tunneling effect or the like is caused. In order to solve the problem of gate leakage, it is preferable that the gate insulating layer 146 be formed using a high-dielectric constant (high-k) material such as hafnium oxide, tantalum oxide, yttrium oxide, hafnium silicate (HfSi$_x$O$_y$ (x>0, y>0)), hafnium silicate (Hf-Si$_x$O$_y$ (x>0, y>0)) to which nitrogen is added, or hafnium aluminate (HfAl$_x$O$_y$ (x>0, y>0)) to which nitrogen is added. By using a high-k material for the gate insulating layer 146, electric characteristics can be ensured and the thickness can be large to prevent gate leakage. Note that a layered structure of a film containing a high-k material and a film containing any one of silicon oxide, silicon nitride, silicon oxynitride, silicon nitride oxide, aluminum oxide, and the like may be employed.

Further, the insulating layer in contact with the oxide semiconductor layer 144 (in this embodiment, the gate insulating layer 146) may be formed using an insulating material including a Group 13 element and oxygen. Many oxide semiconductor materials include a Group 13 element, and an insulating material including a Group 13 element has a good compatibility with the oxide semiconductor. By using an insulating material including a Group 13 element for the insulating layer in contact with the oxide semiconductor layer, an interface with the oxide semiconductor layer can be kept in a favorable state.

An insulating material including a Group 13 element refers to an insulating material including one or more Group 13 elements. As the insulating material including a Group 13 element, gallium oxide, aluminum oxide, aluminum gallium oxide, gallium aluminum oxide, and the like can be given for example. Here, aluminum gallium oxide refers to a material in which the amount of aluminum is larger than that of gallium in atomic percent, and gallium aluminum oxide refers to a material in which the amount of gallium is larger than or equal to that of aluminum in atomic percent.

For example, in foaming a gate insulating layer in contact with an oxide semiconductor layer containing gallium, a material including gallium oxide may be used as a gate insulating layer, so that favorable characteristics can be kept at the interface between the oxide semiconductor layer and the gate insulating layer. When the oxide semiconductor layer and the insulating layer containing gallium oxide are provided in contact with each other, pileup of hydrogen at the interface between the oxide semiconductor layer and the insulating layer can be reduced. Note that a similar effect can be obtained in the case where an element in the same group as a constituent element of the oxide semiconductor is used for the insulating layer. For example, it is effective to form an insulating layer using a material containing aluminum oxide. Since water hardly penetrates aluminum oxide, it is preferable to use a material containing aluminum oxide for prevention of entry of water into the oxide semiconductor layer.

The insulating material of the insulating layer in contact with the oxide semiconductor layer 144 preferably contains oxygen in a proportion higher than that in the stoichiometric composition, by heat treatment in an oxygen atmosphere, oxygen doping, or the like. "Oxygen doping" refers to addition of oxygen into a bulk. Note that the term "bulk" is used in order to clarify that oxygen is added not only to a surface of a thin film but also to the inside of the thin film. In addition, "oxygen doping" includes "oxygen plasma doping" in which oxygen which is made into plasma is added to a bulk. The oxygen doping may be performed using an ion implantation method or an ion doping method.

For example, in the case where the insulating layer in contact with the oxide semiconductor layer 144 is formed of gallium oxide, the composition of gallium oxide can be set to be Ga$_2$O$_x$ (x=3+α, 0<α<1) by heat treatment in an oxygen atmosphere or oxygen doping. In the case where the insulating layer in contact with the oxide semiconductor layer 144 is formed of aluminum oxide, the composition of aluminum oxide can be set to be Al$_2$O$_x$ (x=3+α, 0<α<1) by heat treatment in an oxygen atmosphere or oxygen doping. In the case where the insulating layer in contact with the oxide semiconductor layer 144 is fowled of gallium aluminum oxide (or aluminum gallium oxide), the composition of gallium aluminum oxide (or aluminum gallium oxide) can be set to be Ga$_x$Al$_{2-x}$O$_{3+\alpha}$ (0<x<2, 0<α<1) by heat treatment in an oxygen atmosphere or oxygen doping.

By oxygen doping or the like, an insulating layer which includes a region where the proportion of oxygen is higher than that in the stoichiometric composition can be formed. When the insulating layer including such a region is in contact with the oxide semiconductor layer, excess oxygen in the insulating layer is supplied to the oxide semiconductor layer, and oxygen deficiency defects in the oxide semiconductor layer or at the interface between the oxide semiconductor layer and the insulating layer are reduced.

The insulating layer which includes a region where the proportion of oxygen is higher than that in the stoichiometric composition may be applied to an insulating layer serving as a base film of the oxide semiconductor layer 144 instead of the gate insulating layer 146, or both the gate insulating layer 146 and the base insulating layer.

After the gate insulating layer 146 is formed, second heat treatment is desirably performed in an inert gas atmosphere or an oxygen atmosphere. The temperature of the heat treatment is set in the range of higher than or equal to 200° C. and lower than or equal to 450° C., preferably higher than or equal to 250° C. and lower than or equal to 350° C. For example, the heat treatment may be performed at 250° C. for 1 hour in a nitrogen atmosphere. The second heat treatment can reduce variation in electric characteristics of the transistor. Further, in the case where the gate insulating layer 146 contains oxygen, oxygen is supplied to the oxide semiconductor layer 144 which has been subjected to the dehydration treatment or dehydrogenation treatment to compensate for oxygen deficiency in the oxide semiconductor layer 144, so that an i-type (intrinsic) or substantially i-type oxide semiconductor layer can be formed.

Note that in this embodiment, the second heat treatment is performed after the gate insulating layer 146 is formed; the timing of the second heat treatment is not limited thereto. For example, the second heat treatment may be performed after the gate electrode is formed.

As described above, the first heat treatment and the second heat treatment are applied, whereby the oxide semiconductor layer 144 can be highly purified so as to minimize the amount of impurities that are not main components of the oxide semiconductor.

Figure 10D:
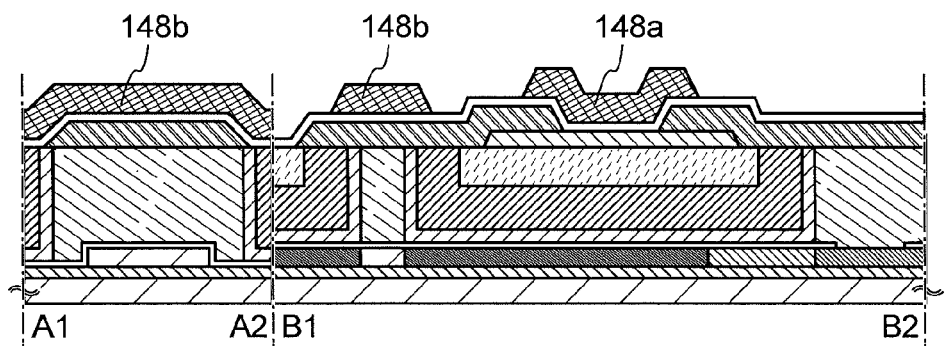

Next, a conductive layer for forming a gate electrode (including a wiring formed using the same layer as the gate electrode) is formed and is processed, so that the gate electrode 148a and the conductive layer 148b are formed (see FIG. 10D).

The gate electrode 148a and the conductive layer 148b can be formed using a metal material such as molybdenum, titanium, tantalum, tungsten, aluminum, copper, neodymium, or scandium, or an alloy material containing any of these materials as its main component. Note that the gate electrode 148*a* and the conductive layer 148*b* may have a single-layer structure or a layered structure.

Figure 11A:
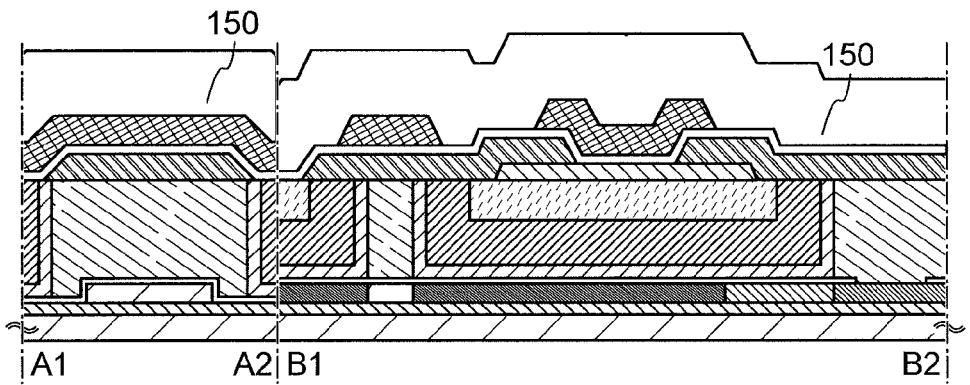
FIGS. 11A to 11C are cross-sectional views relating to manufacturing steps of a semiconductor device.
Figure 11B:
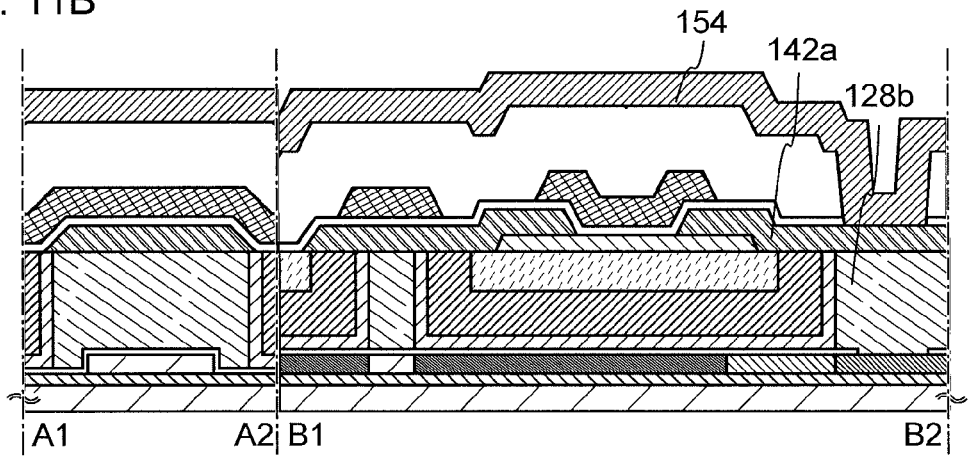

Then, the insulating layer 150 is formed over the gate insulating layer 146, the gate electrode 148*a*, and the conductive layer 148*b* (see FIG. 11A). The insulating layer 150 can be formed by a PVD method, a CVD method, or the like. The insulating layer 150 can be formed using a material including an inorganic insulating material such as silicon oxide, silicon oxynitride, silicon nitride, hafnium oxide, gallium oxide, or aluminum oxide. Note that for the insulating layer 150, a material with a low dielectric constant may be preferably used or a structure with a low dielectric constant (e.g., a porous structure) may be preferably employed. This is because, by reducing the dielectric constant of the insulating layer 150, capacitance between wirings and electrodes can be reduced, which will increase operation speed. Note that although the insulating layer 150 has a single-layer structure in this embodiment, an embodiment of the disclosed invention is not limited to this. The insulating layer 150 may have a layered structure including two or more layers.

Next, an opening reaching the source electrode 142*a* is formed in the gate insulating layer 146 and the insulating layer 150. Then, the wiring 154 connected to the source electrode 142*a* is formed over the insulating layer 150 (see FIG. 11B). The opening is formed by selective etching using a mask or the like.

A conductive layer is formed by a PVD method or a CVD method and then is patterned, so that the wiring 154 is formed. As a material for the conductive layer, an element selected from aluminum, chromium, copper, tantalum, titanium, molybdenum, and tungsten; an alloy containing any of these elements as its component; or the like can be used. Further, one or more materials selected from manganese, magnesium, zirconium, beryllium, neodymium, and scandium in combination may be used.

Specifically, it is possible to employ a method, for example, in which after a thin titanium film (about 5 nm) is formed in a region including the opening of the insulating layer 150 by a PVD method, an aluminum film is formed so as to fill the opening. Here, the titanium film formed by a PVD method has a function of reducing an oxide film (such as a native oxide film) of a formation surface, thereby lowering contact resistance with a lower electrode or the like (the source electrode 142*a*, here). In addition, hillock of aluminum film can be prevented. A copper film may be formed by a plating method after the formation of the barrier film of titanium, titanium nitride, or the like.

The opening formed in the insulating layer 150 is preferably formed in a region overlapping with the conductive layer 128*b*. With the opening in such a region, the element area can be prevented from increasing due to contact regions.

Here, the case where a position where the impurity region 126 and the source electrode 142*a* are connected and a position where the source electrode 142*a* and the wiring 154 are connected overlap with each other without using the conductive layer 128*b* will be described. In this case, an opening (also referred to as a contact in a lower portion) is formed in the insulating layer 136, the insulating layer 138, and the insulating layer 140 that are formed over the impurity region 126, and the source electrode 142*a* is formed in the contact in the lower portion. After that, an opening (also referred to as a contact in an upper portion) is formed in a region overlapping with the contact in the lower portion in the gate insulating layer 146 and the insulating layer 150, and then the wiring 154 is formed. When the contact in the upper portion is foamed in the region overlapping with the contact in the lower portion, the source electrode 142*a* formed in the contact in the lower portion might be disconnected by etching. In order to avoid the disconnection, the contact in the lower portion and the contact in the upper portion are formed so as not to overlap with each other, so that a problem of the increase in the element area occurs.

As described in this embodiment, with the use of the conductive layer 128*b*, the contact in the upper portion can be faulted without disconnection of the source electrode 142*a*. Thus, the contact in the lower portion and the contact in the upper portion can be formed overlapping with each other, so that the element area can be prevented from increasing due to contact regions. In other words, the degree of integration of the semiconductor device can be increased.

Figure 11C:
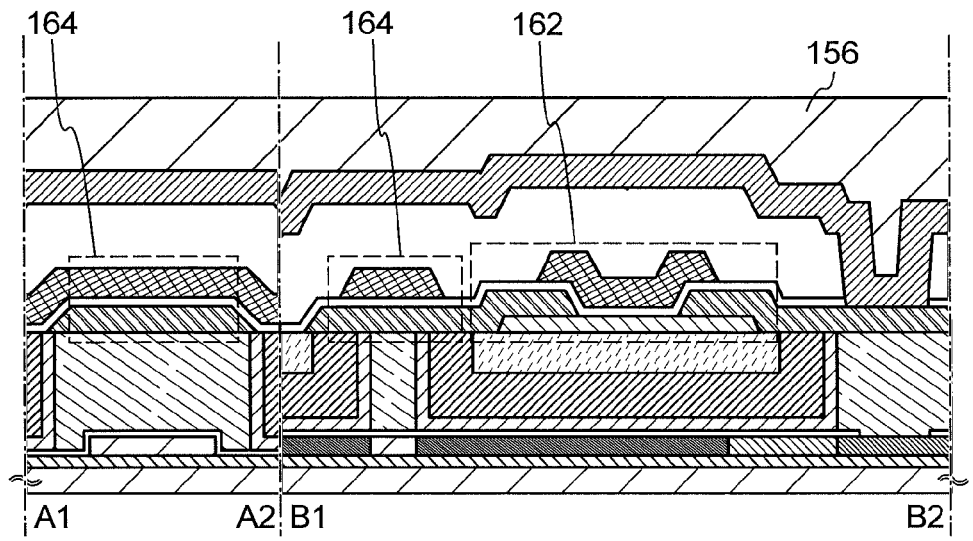

Next, the insulating layer 156 is formed so as to cover the wiring 154 (see FIG. 11C).

Through the above steps, the capacitor 164 and the transistor 162 including the highly purified oxide semiconductor layer 144 are completed (see FIG. 11C).

Figure 13A:
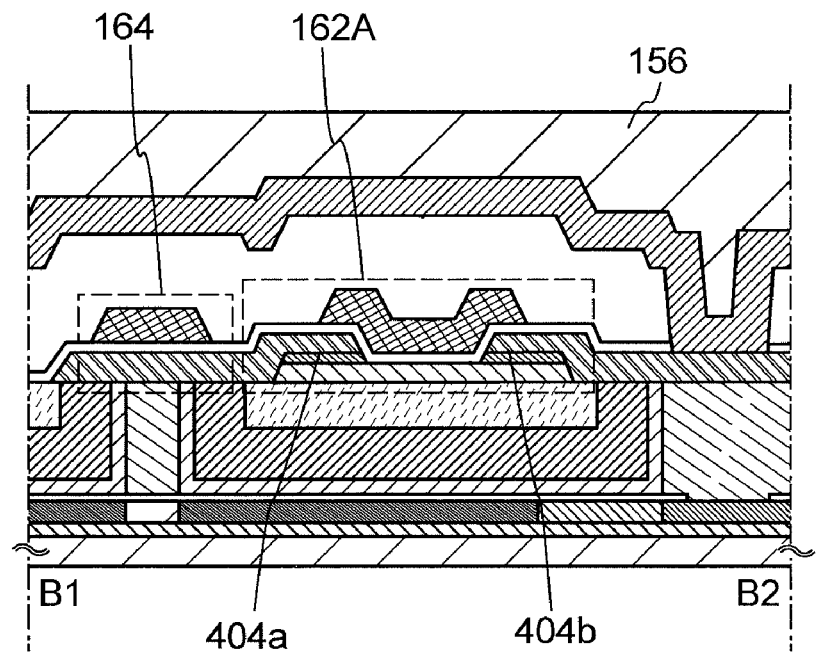
FIGS. 13A and 13B are each a cross-sectional view of a semiconductor device.
Figure 13B:
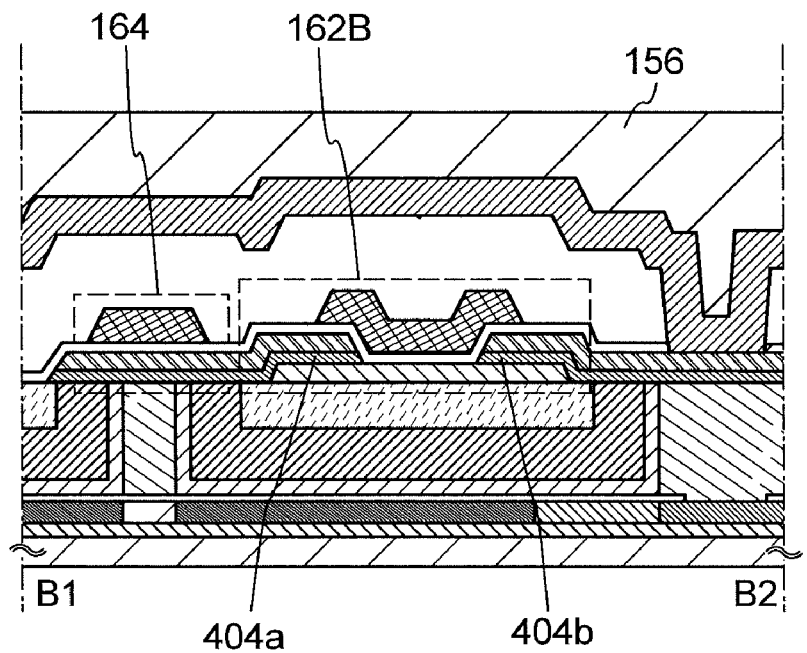

Oxide conductive layers functioning as a source region and a drain region may be provided as buffer layers between the oxide semiconductor layer 144 and the source and drain electrodes 142*a* and 142*b*. FIGS. 13A and 13B illustrate a transistor 162A and a transistor 162B, respectively, where oxide conductive layers are provided in the transistor 162 in FIG. 6A.

In each of the transistors 162A and 162B in FIGS. 13A and 13B, an oxide conductive layer 404*a* and an oxide conductive layer 404*b* which function as a source region and a drain region are formed between the oxide semiconductor layer 144 and the source and drain electrodes 142*a* and 142*b*. A difference between the transistor 162A in FIG. 13A and the transistor 162B in FIG. 13B is that the shapes of the oxide conductive layers 404*a* and 404*b* are different depending on the formation step.

In the transistor 162A in FIG. 13A, a stack of an oxide semiconductor film and an oxide conductive film is formed and processed at a time in a photolithography step, so that the oxide semiconductor layer 144 having an island shape and an oxide conductive film having an island shape are formed. The source electrode 142*a* and the drain electrode 142*b* are formed over the oxide semiconductor layer and the oxide conductive film, and then the island-shaped oxide conductive film is etched using the source electrode 142*a* and the drain electrode 142*b* as masks, so that the oxide conductive layer 404*a* and the oxide conductive layer 404*b* which serve as a source region and a drain region are formed.

In the transistor 162B in FIG. 13B, an oxide conductive film is formed over the oxide semiconductor layer 144, a metal conductive film is formed over the oxide conductive film, and the oxide conductive film and the metal conductive film are processed at a time in a photolithography step; thus, the oxide conductive layer 404*a* and the oxide conductive layer 404*b* which serve as a source region and a drain region, the source electrode 142*a*, and the drain electrode 142*b* are formed.

For etching treatment for the processing the shape of the oxide conductive layer, the etching conditions (e.g., the kind and concentration of etching gas or etchant, and etching time) are adjusted as appropriate to prevent excessive etching of the oxide semiconductor layer.

As the formation method of the oxide conductive layers 404*a* and 404*b*, a sputtering method, a vacuum evaporation method (an electron beam evaporation method or the like), an arc discharge ion plating method, or a spray method can be used. As a material for the oxide conductive layers, zinc oxide, a compound of silicon oxide and indium tin oxide, zinc aluminum oxide, zinc aluminum oxynitride, zinc gallium oxide, or the like can be used. In addition, the above materials may contain silicon oxide.

When the oxide conductive layers are provided as a source region and a drain region between the oxide semiconductor layer 144 and the source electrode 142a and the drain electrode 142b, the source region and the drain region can have lower resistance and the transistors 162A and 162B can operate at high speed.

With the structure including the oxide semiconductor layer 144, the oxide conductive layers 404a and 404b, the source electrode 142a, and the drain electrode 142b, the withstand voltage of the transistor 162A and the transistor 162B can be improved.

Since the oxide semiconductor layer 144 is highly purified in the transistor 162 described in this embodiment, the hydrogen concentration is lower than or equal to $5 \times 10^{19}$ atoms/cm$^3$, preferably lower than or equal to $5 \times 10^{18}$ atoms/cm$^3$, more preferably lower than or equal to $5 \times 10^{17}$ atoms/cm$^3$. In addition, the carrier density of the oxide semiconductor layer 144 is sufficiently low (e.g., lower than $1 \times 10^{12}$/cm$^3$, preferably lower than $1.45 \times 10^{10}$/cm$^3$) in comparison with that of a general silicon wafer (approximately $1 \times 10^{14}$/cm$^3$). Accordingly, the off-state current is also sufficiently small. For example, the off-state current (here, current per micrometer (μm) of channel width) at room temperature (25° C.) is less than or equal to 100 zA (1 zA (zeptoampere) is $1 \times 10^{-21}$ A), preferably less than or equal to 10 zA.

With the use of the highly purified intrinsic oxide semiconductor layer 144, the off-state current of the transistor can be sufficiently reduced easily. Then, by using such a transistor, a semiconductor device in which stored data can be held for an extremely long time can be obtained.

In addition, in the semiconductor device described in this embodiment, the wiring can be shared; thus, a semiconductor device with sufficiently increased degree of integration can be achieved.

The structures, methods, and the like described in this embodiment can be combined as appropriate with any of the structures, methods, and the like described in the other embodiments.

Embodiment 3

Figure 14A:
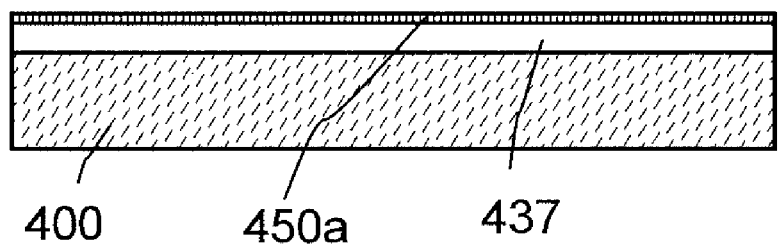
FIGS. 14A to 14C are cross-sectional views relating to manufacturing steps of a semiconductor device.
Figure 14B:
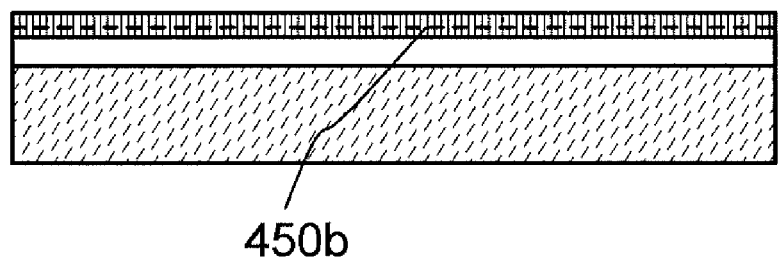

In this embodiment, an embodiment of an oxide semiconductor layer which can be used as the semiconductor layer of the transistor 162 in Embodiment 2 will be described with reference to FIGS. 14A to 14C.

The oxide semiconductor layer of this embodiment has a structure including a first crystalline oxide semiconductor layer and a second crystalline oxide semiconductor layer which is stacked over the first crystalline oxide semiconductor layer and is thicker than the first crystalline oxide semiconductor layer.

An insulating layer 437 is formed over an insulating layer 400. The insulating layer 437 in FIGS. 14A to 14C corresponds to the insulating layer 140 in Embodiment 2. In this embodiment, an oxide insulating layer with a thickness of greater than or equal to 50 nm and less than or equal to 600 nm is formed as the insulating layer 437 by a PCVD method or a sputtering method. For example, a single layer selected from a silicon oxide film, a gallium oxide film, an aluminum oxide film, a silicon oxynitride film, an aluminum oxynitride film, and a silicon nitride oxide film or a stack of any of these films can be used.

Next, a first oxide semiconductor film with a thickness of greater than or equal to 1 nm and less than or equal to 10 nm is formed over the insulating layer 437. The first oxide semiconductor film is formed by a sputtering method, and the substrate temperature in the film formation by a sputtering method is set to be higher than or equal to 200° C. and lower than or equal to 400° C.

In this embodiment, the first oxide semiconductor film is formed to a thickness of 5 nm in an oxygen atmosphere, an argon atmosphere, or an atmosphere containing argon and oxygen under conditions where a target for deposition of an oxide semiconductor (a target for deposition of an In—Ga—Zn—O-based oxide semiconductor including $In_2O_3$, $Ga_2O_3$, and ZnO at 1:1:2 [molar ratio]) is used, the distance between the substrate and the target is 170 mm, the substrate temperature is 250° C., the pressure is 0.4 Pa, and the direct current (DC) power is 0.5 kW.

Next, first heat treatment is performed under a condition where the atmosphere of a chamber in which a substrate is set is an atmosphere of nitrogen or dry air. The temperature of the first heat treatment is higher than or equal to 400° C. and lower than or equal to 750° C. Through the first heat treatment, a first crystalline oxide semiconductor layer 450a is formed (see FIG. 14A).

Although it depends on the temperature of the first heat treatment, the first heat treatment causes crystallization from a film surface and crystal grows from the film surface toward the inside of the film; thus, c-axis aligned crystal is obtained. By the first heat treatment, large amounts of zinc and oxygen gather to the film surface, and one or more layers of graphene-type two-dimensional crystal containing zinc and oxygen and having a hexagonal shape in upper plane are formed at the outermost surface; the layer(s) at the outermost surface grow in the thickness direction to form a stack of layers. By increasing the temperature of the heat treatment, crystal growth proceeds from the surface to the inside and further from the inside to the bottom.

By the first heat treatment, oxygen in the insulating layer 437 that is an oxide insulating layer is diffused to an interface between the insulating layer 437 and the first crystalline oxide semiconductor layer 450a or the vicinity of the interface (within ±5 nm from the interface), whereby oxygen deficiency in the first crystalline oxide semiconductor layer is reduced. Therefore, it is preferable that oxygen be included in (in a bulk of) the insulating layer 437 used as a base insulating layer or at the interface of the insulating layer 437 with the first crystalline oxide semiconductor layer 450a at an amount that exceeds at least the amount of oxygen in the stoichiometric composition.

Next, a second oxide semiconductor film with a thickness of greater than 10 nm is formed over the first crystalline oxide semiconductor layer 450a. The second oxide semiconductor film is formed by a sputtering method, and the substrate temperature in the film formation is set to higher than or equal to 200° C. and lower than or equal to 400° C. By setting the substrate temperature in the film formation to higher than or equal to 200° C. and lower than or equal to 400° C., precursors can be arranged in the oxide semiconductor layer formed on and in contact with the surface of the first crystalline oxide semiconductor layer and so-called orderliness can be obtained.

In this embodiment, the second oxide semiconductor film is formed to a thickness of 25 nm in an oxygen atmosphere, an argon atmosphere, or an atmosphere containing argon and oxygen under conditions where a target for deposition of an oxide semiconductor (a target for deposition of an In—Ga—Zn—O-based oxide semiconductor containing $In_2O_3$, $Ga_2O_3$, and ZnO at 1:1:2 [molar ratio]) is used, the distance between the substrate and the target is 170 mm, the substrate temperature is 400° C., the pressure is 0.4 Pa, and the direct current (DC) power is 0.5 kW.

Next, second heat treatment is performed under a condition where the atmosphere of a chamber in which the substrate is set is a nitrogen atmosphere or a dry air atmosphere. The temperature of the second heat treatment is set to higher than or equal to 400° C. and lower than or equal to 750° C. Through the second heat treatment, a second crystalline oxide semiconductor layer 450b is formed (see FIG. 14B). The second heat treatment is performed in a nitrogen atmosphere, an oxygen atmosphere, or a mixed atmosphere of nitrogen and oxygen, whereby the density of the second crystalline oxide semiconductor layer is increased and the number of defects therein is reduced. By the second heat treatment, crystal growth proceeds in the thickness direction with the use of the first crystalline oxide semiconductor layer 450a as a nucleus, that is, crystal growth proceeds from the bottom to the inside; thus, the second crystalline oxide semiconductor layer 450b is formed.

It is preferable that steps from the formation of the insulating layer 437 to the second heat treatment be successively performed without exposure to the air. The steps from the formation of the insulating layer 437 to the second heat treatment are preferably performed in an atmosphere which is controlled to include little hydrogen and moisture (such as an inert gas atmosphere, a reduced-pressure atmosphere, or a dry-air atmosphere); in terms of moisture, for example, a dry nitrogen atmosphere with a dew point of lower than or equal to −40° C., preferably a dew point of lower than or equal to −50° C. may be employed.

Figure 14C:
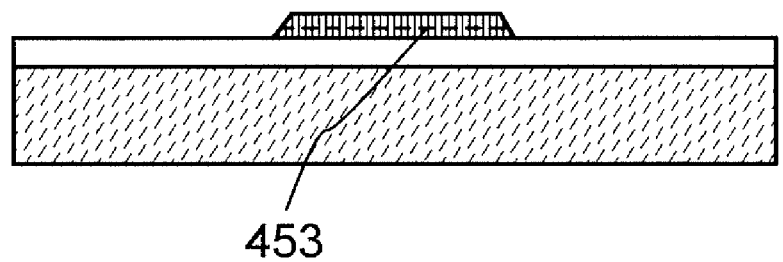

Next, the stack of the oxide semiconductor layers, the first crystalline oxide semiconductor layer 450a and the second crystalline oxide semiconductor layer 450b, is processed into an oxide semiconductor layer 453 including a stack of island-shaped oxide semiconductor layers (see FIG. 14C). In the drawing, the interface between the first crystalline oxide semiconductor layer 450a and the second crystalline oxide semiconductor layer 450b is indicated by a dotted line, and the first crystalline oxide semiconductor layer 450a and the second crystalline oxide semiconductor layer 450b are illustrated as a stack of oxide semiconductor layers; however, the interface is actually not distinct and is illustrated for easy understanding.

The stack of the oxide semiconductor layers can be processed by etching after a mask having a desired shape is formed over the stack of the oxide semiconductor layers. The mask may be formed by a method such as photolithography or an ink jet method.

For the etching of the stack of the oxide semiconductor layers, either dry etching or wet etching may be employed. It is needless to say that both of them may be employed in combination.

A feature of the first crystalline oxide semiconductor layer and the second crystalline oxide semiconductor layer obtained by the above formation method is that they have c-axis alignment. Note that the first crystalline oxide semiconductor layer and the second crystalline oxide semiconductor layer comprise an oxide including a crystal with c-axis alignment (also referred to as C-Axis Aligned Crystal (CAAC)), which has neither a single crystal structure nor an amorphous structure. The first crystalline oxide semiconductor layer and the second crystalline oxide semiconductor layer partly include a crystal grain boundary.

The first and second crystalline oxide semiconductor layers are formed using an oxide semiconductor material containing at least Zn, for example, a four-component metal oxide such as an In—Al—Ga—Zn—O-based material or an In—Sn—Ga—Zn—O-based material; a three-component metal oxide such as an In—Ga—Zn—O-based material, an In—Al—Zn—O-based material, an In—Sn—Zn—O-based material, a Sn—Ga—Zn—O-based material, an Al—Ga—Zn—O-based material, or a Sn—Al—Zn—O-based material; a two-component metal oxide such as an In—Zn—O-based material, a Sn—Zn—O-based material, an Al—Zn—O-based material, or a Zn—Mg—O-based material; or a Zn—O-based material. In addition, an In—Si—Ga—Zn—O-based material, an In—Ga—B—Zn—O-based material, or an In—B—Zn—O-based material may be used. In addition, the above materials may contain $SiO_2$. Here, for example, an In—Ga—Zn—O-based material means an oxide film containing indium (In), gallium (Ga), and zinc (Zn), and there is no particular limitation on the composition ratio. Further, the In—Ga—Zn—O-based material may contain an element other than In, Ga, and Zn.

Without limitation to the two-layer structure in which the second crystalline oxide semiconductor layer is formed over the first crystalline oxide semiconductor layer, a layered structure including three or more layers may be formed by performing a process of film formation and heat treatment for forming a third crystalline oxide semiconductor layer repeatedly after the second crystalline oxide semiconductor layer is formed.

The oxide semiconductor layer 453 including the stack of the oxide semiconductor layers formed by the above formation method can be used as appropriate for the transistor 162 which can be applied to the semiconductor device disclosed in this specification.

In a transistor in which the stack of the oxide semiconductor layers of this embodiment is used as an oxide semiconductor layer, an electric field is not applied from one surface to the other surface of the oxide semiconductor layer and current does not flow in the thickness direction (from one surface to the other surface; e.g., in the vertical direction in FIG. 6A) of the stack of the oxide semiconductor layers. The transistor has a structure in which current mainly flows along the interface of the stack of the oxide semiconductor layers; therefore, even when the transistor is irradiated with light or even when a BT stress is applied to the transistor, deterioration of transistor characteristics is suppressed or reduced.

By forming a transistor with the use of a stack of a first crystalline oxide semiconductor layer and a second crystalline oxide semiconductor layer, like the oxide semiconductor layer 453 in this embodiment, the transistor can have stable electric characteristics and high reliability.

This embodiment can be implemented in appropriate combination with the structures described in the other embodiments.

Embodiment 4

In this embodiment, the case where the semiconductor device described in any of the above embodiments is applied to an electronic device will be described with reference to FIGS. 12A to 12F. In this embodiment, the semiconductor device described in any of the above embodiments is applied to electronic devices such as a computer, a mobile phone (also referred to as a mobile telephone or a mobile telephone device), a portable information terminal (including a portable game machine, an audio reproducing device, and the like), a camera such as a digital camera or a digital video camera, an electronic paper, or a television device (also referred to as a television or a television receiver).

Figure 12A:
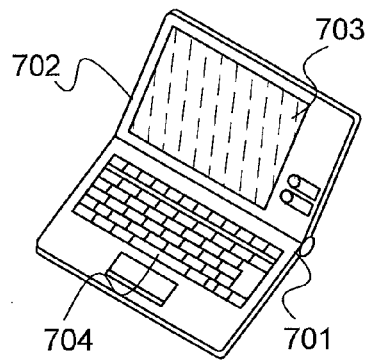
FIGS. 12A to 12F are views each illustrating an electronic device including a semiconductor device.

FIG. 12A is a laptop personal computer including a housing 701, a housing 702, a display portion 703, a keyboard 704, and the like. The semiconductor device described in any of the above embodiments is provided in at least one of the housing 701 and the housing 702. Therefore, a laptop personal computer with sufficiently low power consumption in which writing and reading of data are performed at high speed and data is stored for a long time can be realized.

Figure 12D:
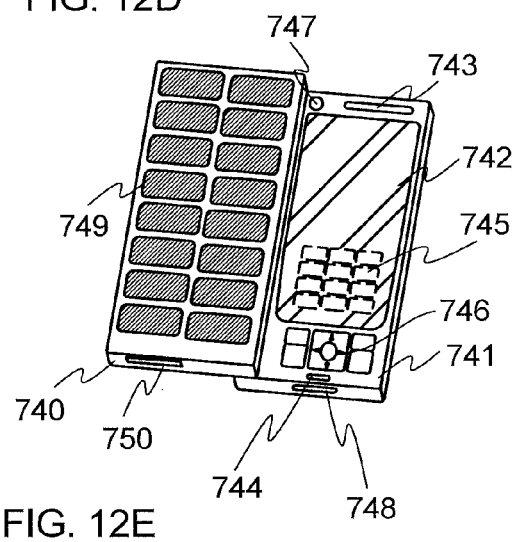
Figure 12B:
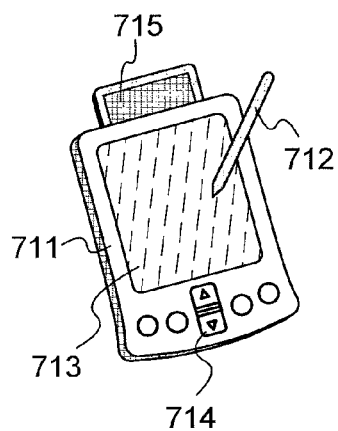

FIG. 12B is a portable information terminal (personal digital assistant (PDA)). A main body 711 is provided with a display portion 713, an external interface 715, operation buttons 714, and the like. Further, a stylus 712 and the like for operation of the portable information terminal are provided. In the main body 711, the semiconductor device described in any of the above embodiments is provided. Therefore, a portable information terminal with sufficiently low power consumption in which writing and reading of data are performed at high speed and data is stored for a long time can be realized.

Figure 12E:
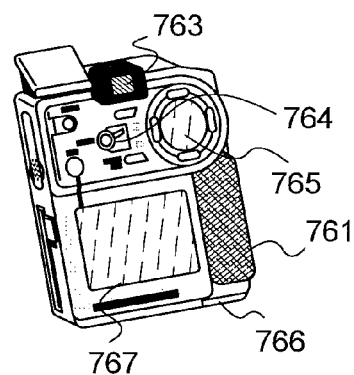
Figure 12C:
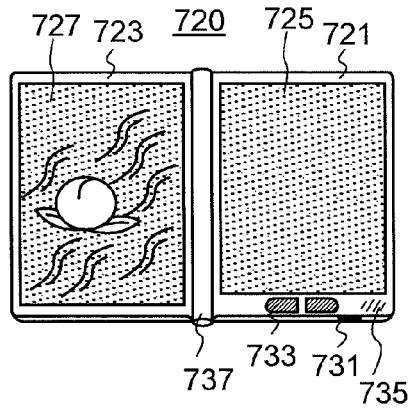

FIG. 12C is an e-book reader 720 on which an electronic paper is mounted. The e-book reader has two housings, a housing 721 and a housing 723. The housing 721 and the housing 723 are provided with a display portion 725 and a display portion 727, respectively. The housings 721 and 723 are connected by a hinge portion 737 and can be opened or closed with the hinge portion 737 as an axis. The housing 721 is provided with a power supply 731, an operation key 733, a speaker 735, and the like. At least one of the housings 721 and 723 is provided with the semiconductor device described in any of the above embodiments. Thus, an e-book reader with sufficiently low power consumption in which writing and reading of data are performed at high speed and data is stored for a long time can be realized.

FIG. 12D is a mobile phone including two housings, a housing 740 and a housing 741. Further, the housing 740 and the housing 741 in a state where they are developed as illustrated in FIG. 12D can shift by sliding so that one is lapped over the other; therefore, the size of the mobile phone can be reduced, which makes the mobile phone suitable for being carried. The housing 741 includes a display panel 742, a speaker 743, a microphone 744, an operation key 745, a pointing device 746, a camera lens 747, an external connection terminal 748, and the like. The housing 740 includes a solar cell 749 for charging the mobile phone, an external memory slot 750, and the like. In addition, an antenna is incorporated in the housing 741. At least one of the housings 740 and 741 is provided with the semiconductor device described in any of the above embodiments. Therefore, a mobile phone with sufficiently low power consumption in which writing and reading of data are performed at high speed and data is stored for a long time can be realized.

FIG. 12E is a digital camera including a main body 761, a display portion 767, an eyepiece 763, an operation switch 764, a display portion 765, a battery 766, and the like. In the main body 761, the semiconductor device described in any of the above embodiments is provided. Thus, a digital camera with sufficiently low power consumption in which writing and reading of data are performed at high speed and data is stored for a long time can be realized.

Figure 12F:
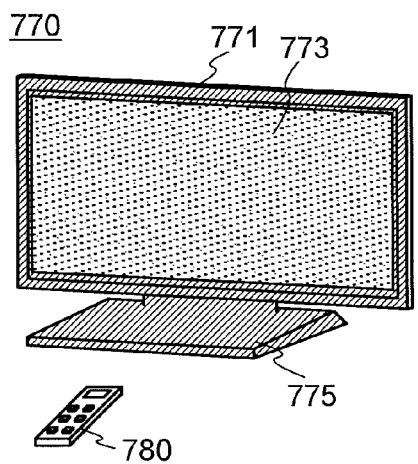

FIG. 12F is a television device 770 including a housing 771, a display portion 773, a stand 775, and the like. The television device 770 can be operated with a switch of the housing 771 or a remote controller 780. The semiconductor device described in any of the above embodiments is mounted on the housing 771 and the remote controller 780. Thus, a television device with sufficiently low power consumption in which writing and reading of data are performed at high speed and data is stored for a long time can be realized.

As described above, the electronic devices described in this embodiment each include the semiconductor device described in any of the above embodiments; thus, electronic devices with low power consumption can be realized.

Embodiment 5

In this embodiment, time needed for writing and reading of data in a semiconductor device having the circuit structure illustrated in FIG. 1A will be described.

Figure 15:
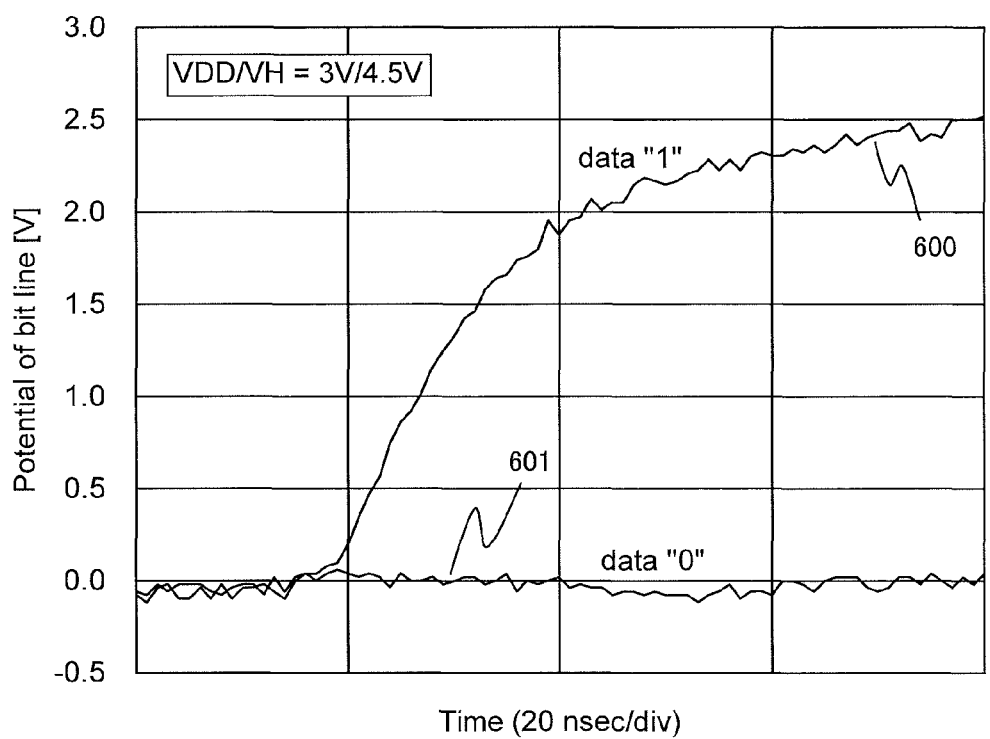
FIG. 15 is a graph showing a result of measuring a temporal change in potential of a bit line BL.

First, as for the semiconductor device having the circuit structure illustrated in FIG. 1A, a temporal change in potential of the bit line BL when a power supply potential $V_{DD}$ or a ground potential GND was supplied to the bit line BL in writing was measured. FIG. 15 shows the temporal change in potential of the bit line BL, which was obtained by the measurement.

The power supply potential $V_{DD}$ is a potential that is supplied to the bit line when data "1" is written to the memory cell. The ground potential GND is a potential that is supplied to the bit line when data "0" is written to the memory cell.

In FIG. 15, as a waveform of the bit line BL in writing of data "1", a solid line 600 represents a temporal change in potential of the bit line BL when a power supply potential $V_{DD}$ of 3 V was supplied, about 80 nsec after the start of the measurement, to the bit line BL that had been kept at the ground potential GND. Also, in FIG. 15, as a waveform of the bit line BL in writing of data "0", a solid line 601 represents a temporal change in potential of the bit line BL when the ground potential GND was supplied to the bit line BL.

As represented by the solid line 601 in FIG. 15, when data "0" was written, the potential of the bit line BL was kept at about 0 V. On the other hand, as represented by the solid line 600 in FIG. 15, it was found that when data "1" was written, the potential of the bit line BL was increased to about 2.4 V, about 40 nsec after the start of the supply of the power supply potential $V_{DD}$ to the bit line BL.

Therefore, it was found that time needed for supplying the power supply potential $V_{DD}$ to the bit line BL was about 40 nsec.

Figure 16:
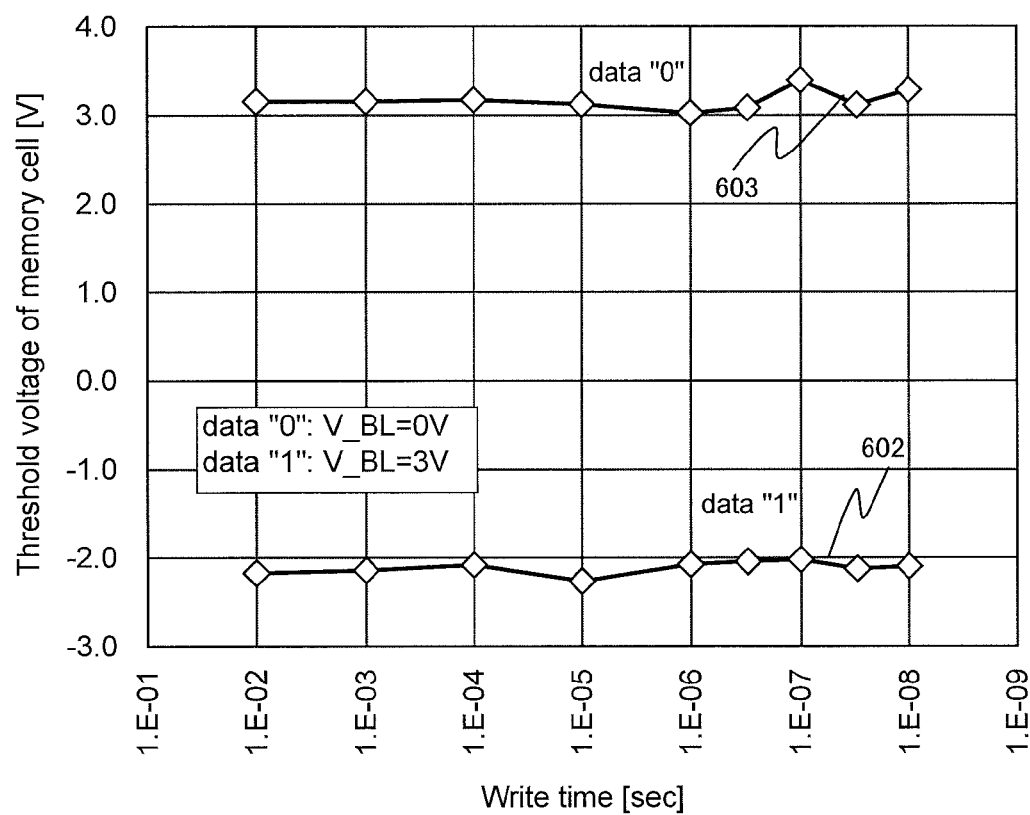
FIG. 16 is a graph showing a result of measuring a threshold voltage window of a memory cell.

Then, as for the semiconductor device having the circuit structure illustrated in FIG. 1A, a threshold voltage window of a memory cell in the case where time (writing time) during which a potential $V_H$ was supplied to the gate electrode of the transistor 162 was changed was measured. FIG. 16 shows a relation between the threshold voltage window of the memory cell and writing time, which was obtained by the measurement.

The measurement was performed in such a manner that the ground potential GND was supplied to the bit line BL when data "0" was written, and the power supply potential $V_{DD}$ was supplied to the bit line BL when data "1" was written. The potential $V_H$ was set to 4.5 V and the power supply potential $V_{DD}$ was set to 3 V.

Note that the threshold voltage window of the memory cell includes the threshold voltage of the memory cell when data "0" was written and the threshold voltage of the memory cell when data "1" was written. The threshold voltage of the memory cell is a potential of the write-read word line C, which is needed to turn on the transistor 160.

In FIG. 16, a solid line 602 represents a relation between writing time and the threshold voltage of the memory cell when data "1" was written. In addition, in FIG. 16, a solid line 603 represents a relation between writing time and the threshold voltage of the memory cell when data "0" was written.

As represented by the solid line 602 in FIG. 16, when the power supply potential $V_{DD}$ was supplied to the bit line BL, the threshold voltage of the memory cell was about −2 V in the case of a writing time of 10 msec. In addition, as represented by the solid line 603 in FIG. 16, when the ground potential GND was supplied to the bit line BL, the threshold voltage of the memory cell was about 3 V in the case of a writing time of 10 msec. In either case, the threshold voltage of the memory cell did not change significantly even when writing time was shortened to 10 nsec.

The above result shows that data can be written to the memory cell in a writing time of about 10 nsec.

Figure 17:
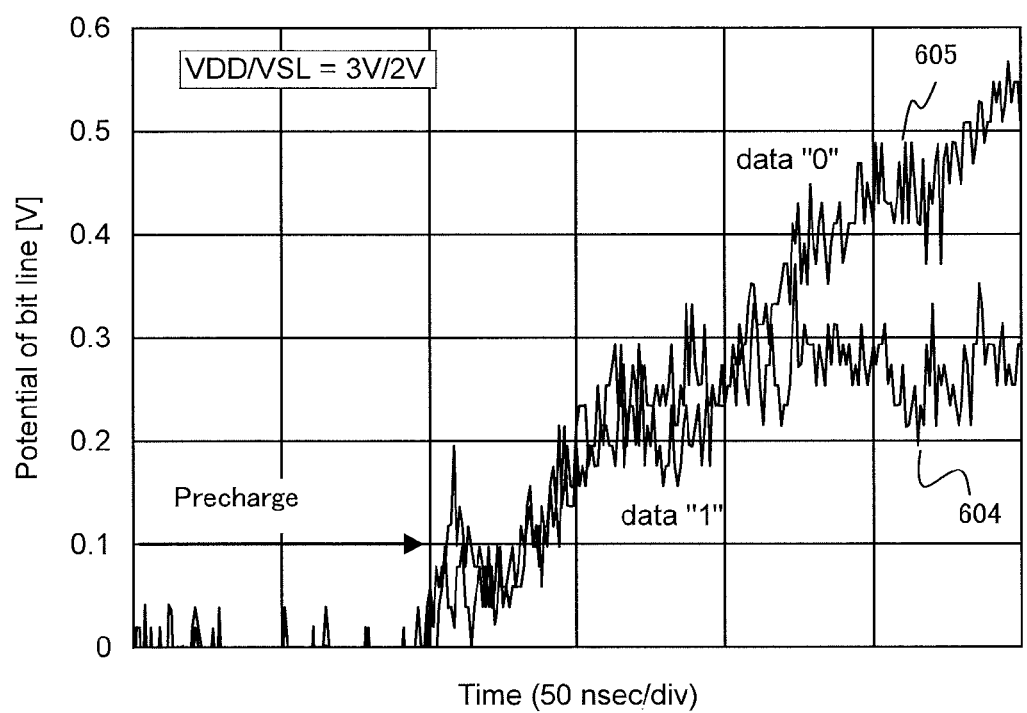
FIG. 17 is a graph showing a result of measuring a temporal change in potential of a bit line BL.

Next, as for the semiconductor device having the circuit structure illustrated in FIG. 1A, a temporal change in potential of the bit line BL when a potential $V_R$ was supplied to the source line SL and the power supply potential $V_{DD}$ was supplied to the write-read word line C in reading of data was measured. FIG. 17 shows the temporal change in potential of the bit line BL, which was obtained by the measurement.

The bit line BL was precharged by being supplied with the ground potential GND. The potential $V_R$ which was supplied to the source line SL was set to 2 V and the power supply potential $V_{DD}$ was set to 3 V.

In FIG. 17, a solid line 604 represents the temporal change in potential of the bit line BL in reading of data in the memory cell to which data "1" was written in writing of data. In addition, a solid line 605 represents the temporal change in potential of the bit line BL in reading of data in the memory cell to which data "0" was written in writing of data.

As represented by the solid line 604 and the solid line 605 in FIG. 17, it was found that after the precharge was completed, the potential of the bit line BL began to increase, and that about 150 nsec after the completion of the precharge, a potential difference between the bit line BL corresponding to data "0" and the bit line BL corresponding to data "1" was about 0.2 V. The potential of the bit line BL corresponding to data "0" was increased to about 0.2 V, about 70 nsec after the completion of the precharge, which indicates that a reading operation might be performed for less than or equal to 100 nsec.

Accordingly, the semiconductor device according to an embodiment of the present invention can operate at high speed.

In portable electronic devices such as a mobile phone, a smartphone, and an e-book reader, an SRAM or a DRAM is used so as to store image data temporarily. An SRAM or a DRAM is used in a portable electronic device because it can perform an operation such as writing or reading of data faster than a flash memory or the like and thus is suitable to be used in processing of image data. However, although an SRAM has an advantage of operating at high speed, one memory cell in an SRAM includes six transistors, resulting in a disadvantage of a large area of the memory cell. Provided that the minimum feature size of a design rule is F, the area of a memory cell in an SRAM is generally 100 $F^2$ to 150 $F^2$. Therefore, a price per bit of an SRAM is the most expensive among semiconductor memory devices. On the other hand, in a DRAM, one memory cell includes one transistor and one capacitor. Thus, the area of a memory cell in a DRAM is small, e.g., less than or equal to 10 $F^2$. However, in the case of a DRAM, a refresh operation is necessary and power is consumed even when a rewriting operation is not performed. In the semiconductor device according to an embodiment of the present invention, the area of a memory cell is around 10 $F^2$ and frequent refresh operations are not necessary. Therefore, the semiconductor device is different from a general SRAM or DRAM because it has two merits: a smaller area of a memory cell and lower power consumption which are important for portable electronic devices.

This application is based on Japanese Patent Application serial No. 2010-189587 filed with Japan Patent Office on Aug. 26, 2010 and Japanese Patent Application serial No. 2011-005766 filed with Japan Patent Office on Jan. 14, 2011, the entire contents of which are hereby incorporated by reference.

What is claimed is:

1. A method for driving a semiconductor device, the semiconductor device comprising:
a first transistor, a second transistor, and a capacitor,
wherein one of source and drain of the first transistor and one of source and drain of the second transistor are electrically connected to a bit line,
wherein a gate of the second transistor is electrically connected to a write word line,
wherein the other of source and drain of the first transistor is electrically connected to a source line,
wherein one electrode of the capacitor is electrically connected to a write-read word line, and
wherein a gate of the first transistor, the other of source and drain of the second transistor, and the other electrode of the capacitor are electrically connected to each other to form a node where electric charge is held,
the method comprising the steps of:
supplying a potential at which the second transistor is turned on to the write word line, and supplying a ground potential to the source line in a writing period, thereby storing electric charge in the node; and
supplying a ground potential to the write word line and the write-read word line, and supplying a same potential to the source line and the bit line in a holding period after the writing period, thereby holding the electric charge in the node.

2. The method for driving a semiconductor device, according to claim 1, wherein a ground potential is supplied to the source line and the bit line in the holding period.

3. The method for driving a semiconductor device, according to claim 1, wherein a channel formation region of the second transistor comprises an oxide semiconductor.

4. The method for driving a semiconductor device, according to claim 1, wherein the first transistor is a p-channel transistor.

5. A method for driving a semiconductor device comprising memory cells, each of the memory cells comprising:
a first transistor, a second transistor, and a capacitor,
wherein one of source and drain of the first transistor and one of source and drain of the second transistor are electrically connected to a bit line,
wherein a gate of the second transistor is electrically connected to a write word line,
wherein the other of source and drain of the first transistor is electrically connected to a source line,
wherein one electrode of the capacitor is electrically connected to a write-read word line, and
wherein a gate of the first transistor, the other of source and drain of the second transistor, and the other electrode of the capacitor are electrically connected to each other to form a node where electric charge is held,
the method comprising the steps of:
supplying a potential at which the second transistor is turned on to the write word line, and supplying a ground potential to the source line in a writing period, thereby storing electric charge in the node;
supplying a ground potential to the write word line and the write-read word line, and supplying a same potential to the bit line and the source line in a holding period after the writing period, thereby holding the electric charge in the node; and supplying a power supply potential to the write-read word line connected to one of the memory cells in a non-selected state, and supplying a ground potential to the write-read word line connected to another one of the memory cells in a selected state in a reading period, thereby reading the electric charge held in the node in the memory cell in the selected state.

6. The method for driving a semiconductor device, according to claim 5, wherein a ground potential is supplied to the source line and the bit line in the holding period.

7. The method for driving a semiconductor device, according to claim 5, wherein a channel formation region of the second transistor comprises an oxide semiconductor.

8. The method for driving a semiconductor device, according to claim wherein the first transistor is a p-channel transistor.

* * * * *

UNITED STATES PATENT AND TRADEMARK OFFICE
CERTIFICATE OF CORRECTION

| | | |
|---|---|---|
| PATENT NO. | : 8,339,837 B2 | Page 1 of 1 |
| APPLICATION NO. | : 13/206547 | |
| DATED | : December 25, 2012 | |
| INVENTOR(S) | : Hiroki Inoue et al. | |

It is certified that error appears in the above-identified patent and that said Letters Patent is hereby corrected as shown below:

Column 22, line 33, replace "BF" with --HF--

Column 24, line 58, replace "157G" with --7G--

Column 25, line 55, replace "framed" with --formed--

Column 31, line 41, replace "foaming" with --forming--

Column 32, line 13, replace "fowled" with --formed--

Column 33, line 67, replace "foamed" with --formed--

Column 34, line 9, replace "faulted" with --formed--

Column 44, line 5, in claim 8, after "claim" insert --5--

Signed and Sealed this
Nineteenth Day of February, 2013

Teresa Stanek Rea
*Acting Director of the United States Patent and Trademark Office*